(12) United States Patent
Fouad et al.

(10) Patent No.: US 8,356,265 B2
(45) Date of Patent: Jan. 15, 2013

(54) OFFSET FILL

(76) Inventors: Fady Fouad, Cairo (EG); Hazem Hegazy, Cairo (EG)

( * ) Notice: Subject to any disclaimer, the term of this patent is extended or adjusted under 35 U.S.C. 154(b) by 520 days.

(21) Appl. No.: 12/046,628

(22) Filed: Mar. 12, 2008

(65) Prior Publication Data

US 2009/0013298 A1  Jan. 8, 2009

Related U.S. Application Data

(60) Provisional application No. 60/896,225, filed on Mar. 21, 2007.

(51) Int. Cl.
*G06F 17/50* (2006.01)
*H01L 21/469* (2006.01)
(52) U.S. Cl. ......... 716/122; 716/118; 716/119; 438/758
(58) Field of Classification Search .......... 716/118–119, 716/122; 438/758
See application file for complete search history.

(56) References Cited

U.S. PATENT DOCUMENTS 5,822,214 A * 10/1998 Rostoker et al. ............... 716/10
2001/0039647 A1 * 11/2001 Mori et al. ..................... 716/21
2008/0034332 A1 * 2/2008 Anikin et al. ................... 716/2

OTHER PUBLICATIONS

"An Exhaustive Method for Characterizing the Interconnect Capacitance Considering the Floating Dummy-Fills by Employing an Efficient Field Solving Algorithm," by Jin-Kyu Park et al., Simulation of Semiconductor Processes and Devices, 2000.
"Dummy Filling Methods For Reducing Interconnect Capacitance And Number Of Fills," by Atsushi Kurokawa et al., Sixth International Symposium on Quality of Electronic Design, Mar. 21-23, 2005.

* cited by examiner

*Primary Examiner* — Stacy Whitmore

(57) ABSTRACT

Techniques are described for increasing the density of structures in a layout circuit design, while reducing undesired total interconnect capacitance that might otherwise be created by the increase in structure density. Data representing a pattern of fill structures is added to the fill regions of the design for one of the layers. Data representing a pattern of fill structures then is added to the fill regions of the design for another of the layers adjacent to the first layer. In the design for the second conductive layer, however, the pattern of fill structures is offset from the pattern of fill structures added to the design for the first layer in a direction substantially parallel to the layers. The offset may be selected to minimize or otherwise reduce the amount of overlap between the fill structures along a direction substantially perpendicular to the layers, thereby reducing the total interconnect capacitance associated with the layers.

72 Claims, 16 Drawing Sheets

OFFSET FILL

RELATED APPLICATIONS

This application claims priority under 35 U.S.C. §119 to U.S. Provisional Patent Application No. 60/896,225, entitled "Offset Metal Fill," filed on Mar. 21, 2007 and naming Fady Fouad and Hazem Hegazy as inventors, which application is incorporated entirely herein by reference.

FIELD OF THE INVENTION

The present invention relates to various techniques and tools to assist in the design of a circuit device, such as an integrated circuit design. Various aspects of the present invention are particularly applicable to providing structures to fill open spaces on the surfaces of layers in a circuit device.

BACKGROUND OF THE INVENTION

Electronic circuits, such as integrated microcircuits, are used in a variety of products, from automobiles to microwaves to personal computers. Designing and fabricating microcircuit devices typically involves many steps, known as a "design flow." The particular steps of a design flow often are dependent upon the type of microcircuit, its complexity, the design team, and the microcircuit fabricator or foundry that will manufacture the microcircuit. Software and hardware "tools" then verify the design at various stages of the design flow by running software simulators and/or hardware emulators, and errors in the design are corrected.

Several steps are common to most design flows. First, the specifications for the new microcircuit are described in terms of logical operations, typically using a Hardware Design Language (HDL), such as the Very high speed integrated circuit Hardware Design Language (VHDL). After the accuracy of the logical design is confirmed, the logical design is converted into device design data by synthesis software. The device design data, in the form of a schematic, represents the specific electronic devices, such as transistors, resistors, and capacitors, which will achieve the desired logical result and their interconnections. Preliminary timing estimates for portions of the circuit may also be made at this stage, using an assumed characteristic speed for each device. This schematic generally corresponds to the level of representation displayed in conventional circuit diagrams.

Once the relationships between circuit devices have been established, the design is again transformed into physical design data describing specific geometric elements, often referred to as a "layout" design. These geometric elements (typically polygons) define the shapes that will be created in various materials to form the specified circuit devices. Custom layout editors, such as Mentor Graphics' IC Station or Cadence's Virtuoso, are commonly used for this task. Automated place and route tools also will frequently be used to define the physical layouts, especially the placement of wires that will be used to interconnect the circuit devices. Each layer of the microcircuit will have a corresponding layer representation in the layout design, and the geometric shapes described in a layer representation will define the relative locations of the circuit elements that will make up the circuit device. For example, the shapes in the representation of an implant layer will define the regions where doping will occur, while the shapes in the representation of a metal layer will define the locations of metal wires used to connect the circuit devices. Thus, the layout design data represents the patterns that may be written onto masks used to fabricate the desired microcircuit during a photolithographic process.

Modern integrated circuits typically will be formed of multiple layers of material, such as metal, diffusion material, and polysilicon. During the manufacturing process, layers of material are formed on top of one another sequentially. After each layer is created, portions of the layer are removed to create circuit element structures. Together, the circuit element structures form the operational circuit devices which make up the integrated circuit, such as transistors, capacitors and resistors. Before a new layer is formed over the circuit element structures in an existing layer, however, the existing layer must be polished to ensure planarity. Polishing, using any of various types of polishing processes, is sometimes generically referred to as "planarization."

One problem with conventional planarization methods is that different materials will have different densities, so softer materials will be polished more than harder materials. As a result, a layer's surface may become uneven, causing the next layer to have an uneven surface as well. If this occurs, upper (i.e., subsequently formed) layers of material will have a very irregular surface topography. Such irregular surface topographies may cause a variety of flaws in a circuit device, such as holes, loss of contact, and other defects.

To improve the planarity of a layer of material, the integrated circuit designer (or manufacturer) often will analyze the layout circuit design for the layer to identify empty regions. For example, the designer or manufacturer may analyze the design of the layer to determine the density of the functional structures that will be formed in the layer, and identify regions that are empty of these functional structures. The designer or manufacturer will then modify the layout circuit design to fill these empty regions with data representing "dummy" or "fill" structures. That is, the designer or manufacturer will modify a design to increase the density of structures that will be formed in the layer. When the circuit is manufactured, these "dummy" or "fill" structures will be formed alongside the "functional" circuit element structures (i.e., the structures used to form functional circuit devices), so that the overall surface of the layer is more consistently flat. This type of corrective technique may be implemented using a software application for identifying and manipulating structures defined in a layout circuit design, such as one or more tools in the CALIBRE® family of software tools available from Mentor Graphics® Corporation of Wilsonville, Oreg.

While this corrective technique often improves the planarity of layers in an integrated circuit, it has some drawbacks. For example, fill structures that are not electronically coupled to an interconnect (e.g., a signal line or wire) or other functional circuit structure can be automatically generated when the circuit design is finalized. These "floating" fill structures will significantly increase the coupling capacitance between adjacent interconnects, however, which in turn may create unwanted crosstalk between adjacent interconnects. These "floating" fill structures may also increase the total interconnect capacitance for the layer.

On the other hand, if a fill structure is electrically coupled to an interconnect, then this "grounded" fill structure may significantly increase the interconnect's total capacitance. This increased interconnect total capacitance in turn may affect the delay of signals carried by the interconnect. Thus, if the designer or manufacturer inadvertently fills too much of the empty regions with grounded fill structures, the increased capacitance in the manufactured device may cause one or more of the circuit devices to exceed their minimum timing requirements. In addition, "grounded" fill structures must be routed like the interconnects, creating further complexity for the circuit design.

To address these deficiencies, various fill techniques have focused on manipulating the shape of the fill structures, or their placement relative to other functional structures in a layer of a circuit. For example, some techniques may place long fill structures parallel to interconnect lines, while other techniques may place fill structures orthogonal to interconnect lines. While a variety of fill techniques have been proposed, there is still a continuing desire to be able to add fill structures to a circuit while curtailing the amount of additional capacitance created by the additional fill structures.

BRIEF SUMMARY OF THE INVENTION

Advantageously, various examples of the invention provide techniques for increasing the density of structures in a layout circuit design, while reducing undesired total interconnect capacitance that might otherwise be created by the increase in structure density. According to various implementations of the invention, a circuit design describing a multilayer circuit is analyzed to identify empty regions that should be filled with fill structures. For example, with some implementations of the invention, the empty regions suitable for adding fill structures (referred to hereafter as "fill" regions) in each relevant layer of the device are identified. Next, data representing fill structures is added to the fill regions of the design for one of the layers. Data representing fill structures then is added to the fill regions of the design for another of the layers adjacent to the first layer. In the design for the second layer, however, the pattern of fill structures is offset from the pattern of fill structures added to the design for the first conductive layer in a direction substantially parallel to the layers.

With some examples of the invention, the offset between reference positions in adjacent conductive layers is selected to minimize or otherwise reduce the amount of overlap between the fill structures along a direction substantially perpendicular to the layers. Because the overlap between fill structures in adjacent layers is reduced, the capacitance created between overlapping fill structures likewise is reduced. With some implementations of the invention, the pattern of fill structures added to the design of the second layer may be different than the pattern of fill structures added to the design of the first layer. More conveniently, however, both patterns of fill structures will be the same. For some implementations of the invention, the pattern may be an array of fill structures, each having a rectangular or square footprint.

DETAILED DESCRIPTION OF THE INVENTION

Operating Environment

Figure 1:
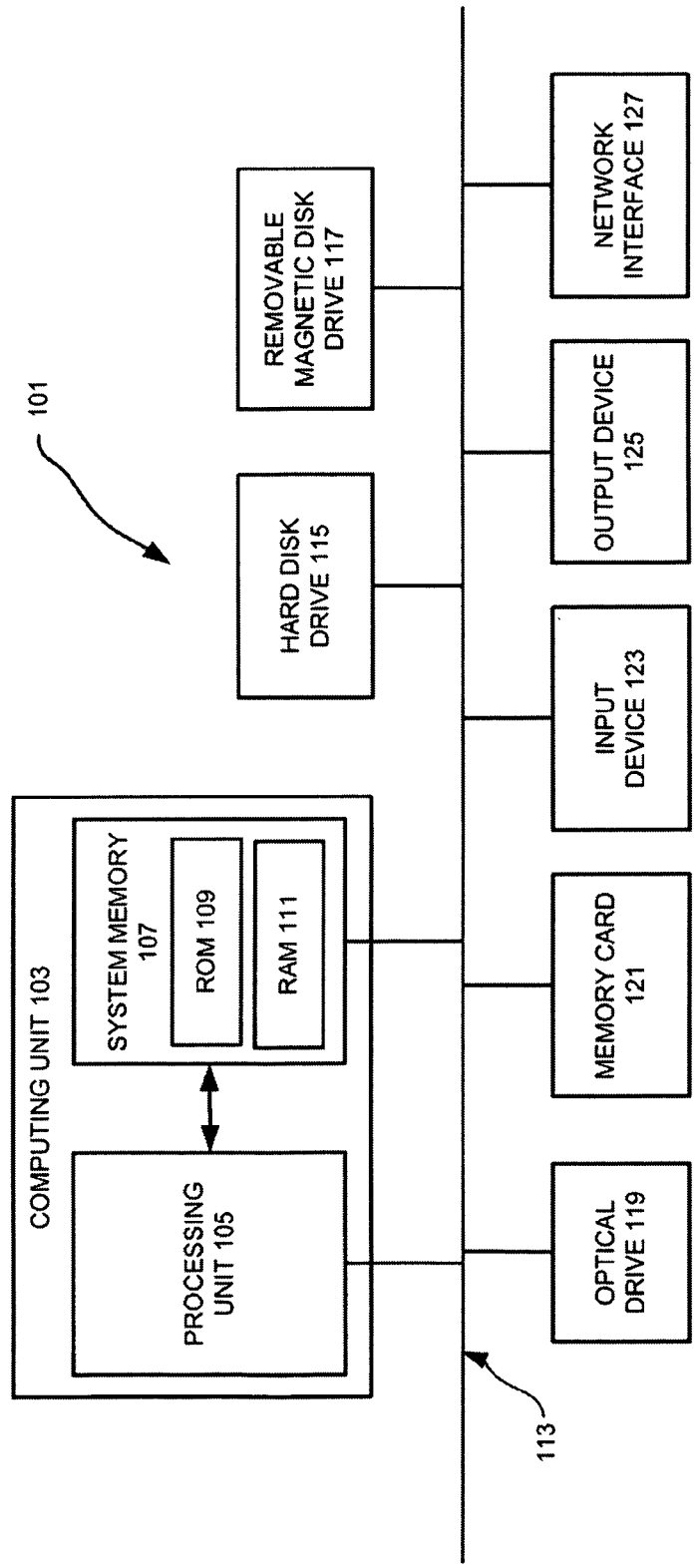
FIG. 1 illustrates an example of a computing device that may be employed to implement various examples of the invention.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Fill Structure Placement Tool

As noted above, various embodiments of the invention may be implemented by the execution of software instructions with a programmable computer. For example, some embodiments of the invention may be implemented using the CALIBRE® software tools available from Mentor Graphics® Corporation of Wilsonville, Oreg. It should be appreciated, however, that other software tools for identifying and manipulating data in a layout circuit design are known in the art, and thus may alternately or additionally be used to implement various examples of the invention. Further, a user may employ separate software tools in combination to implement various aspects of the invention. For example, a user may employ one or more software tools, such as the CALIBRE® software tools, to identify fill regions in a layout circuit design, and then use one or more other software tools, such as proprietary software tools, or other tools available from Mentor Graphics® Corporation or other tool vendors, to add fill structures to those fill regions.

Figure 2:
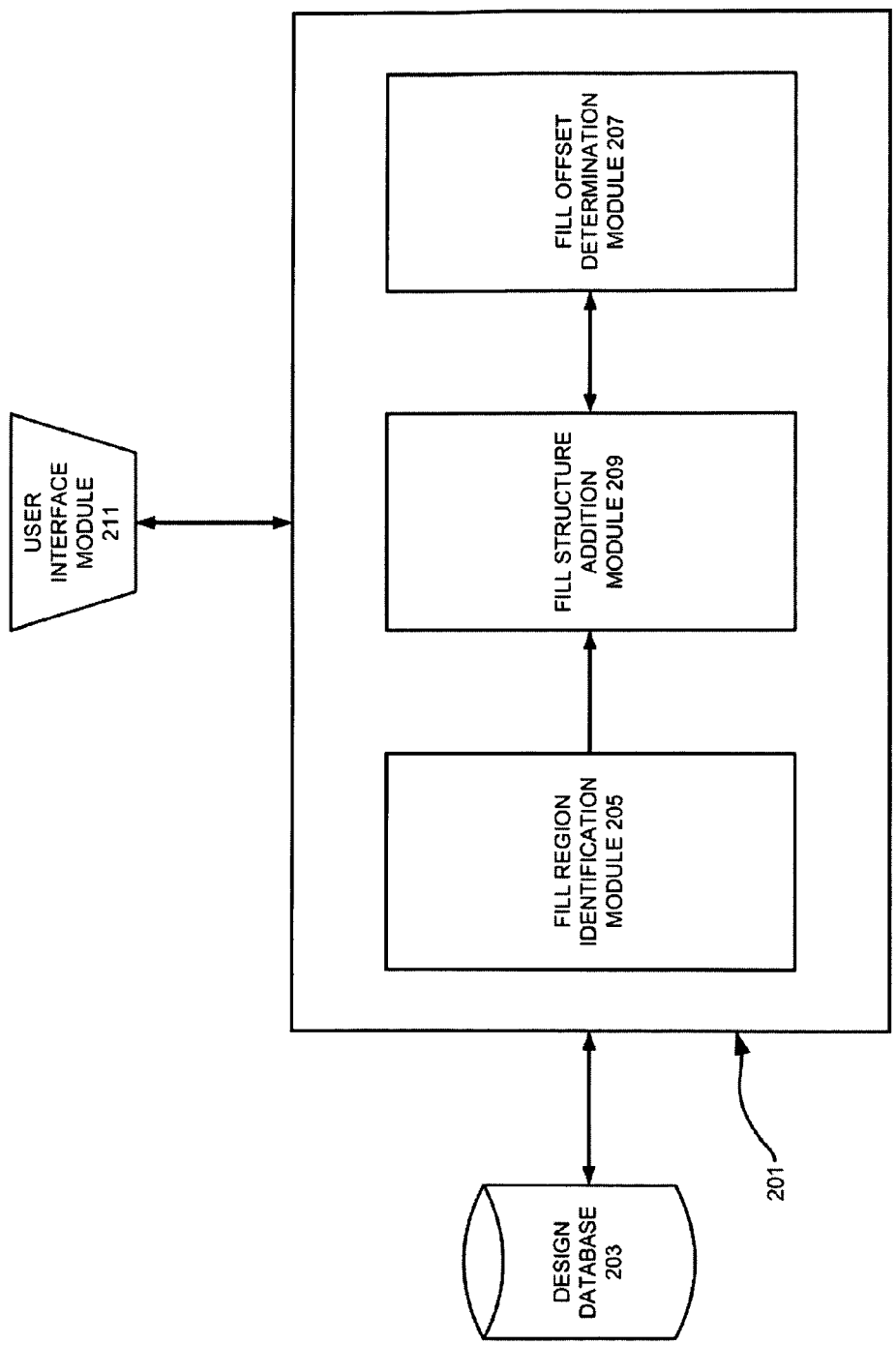
FIG. 2 illustrates a tool that can be used to add data representing fill structures to a circuit design according to various examples of the invention.

FIG. 2 illustrates an example of a fill creation tool 201 that may be employed according to various examples of the invention to add data representing fill structures to a circuit design. As will be discussed in more detail below, the fill creation tool 201 can be used to modify a circuit design so that one or more layers in the design will have fill structures, thereby increasing its structure density. With some examples of the invention, initial circuit design data may be provided directly to the fill creation tool 201. Alternately, the fill creation tool 201 may retrieve circuit design data from a design database 203. With various examples of the invention, the circuit design data may be in any desired type of data format, such as GDS-II, Oasis, Open Access, Milkyway, LEF/DEF, or Volcano. Also, the circuit design data may describe an entire circuit, or it may describe only a portion of a circuit. Accordingly, as used herein, the terms "circuit design" and "circuit design data" will be used to encompass both design data for an entire circuit and design data for only a portion of an entire circuit.

Figure 3:
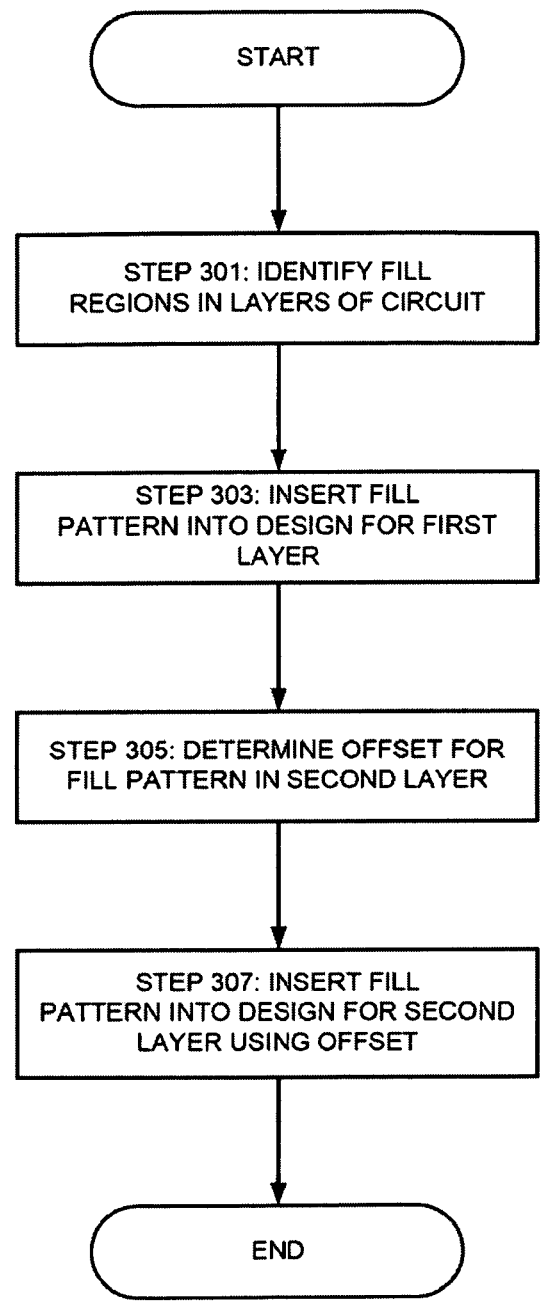
FIG. 3 illustrates a flowchart describing a method of adding data representing fill structures to a circuit design that may be implemented according to various examples of the invention.

As seen in FIG. 2, the fill creation tool 201 may include a fill region identification module 205, a fill offset determination module 207, and a fill structure addition module 209. Some implementations of the fill creation tool 201 also may optionally include a user interface module 211. Each of the modules 205-211 may be implemented by the execution of software instructions on a programmable computer, through hardware, such as special-purpose circuitry, or some combination thereof. The operation of the fill creation tool 201 will be described in more detail with reference to the flowchart illustrated in FIG. 3.

Identifying Fill Regions

Initially, in step 301, a user (such as, for example, a circuit designer, a manufacturer, or other authorized person) initiates the fill region identification module 205 to identify fill regions in a layout circuit design for one or more layers of the circuit. The user may, for example, initiate the operation of the fill region identification module 205 through the user interface module 211. Alternately, the fill region identification module 205 may be activated automatically as part of a larger electronic design automation (EDA) process. In response, the fill region identification module 205 will identify areas in a circuit design that are empty of existing structures.

Typically, the fill creation tool 201 will operate on a "layout" type circuit design. In a "layout" type circuit design, a physical structure conventionally is represented by a polygon. During a photolithographic manufacturing process, the polygon representing the structure (or another shape generally corresponding to the polygon) will be recreated on a photolithographic mask, which then will be used to form the structure in a physical layer of the circuit. Polygons in a layout type circuit design can generally be organized into two separate categories: functional polygons and fill polygons. Functional polygons represent the structures in a circuit that will perform some type of electrical function, such as wiring or interconnect lines, transistor gates or other contacts, resistors, etc. Fill polygons, on the other hand, represent structures that will not perform any type of electrical function. Fill polygons may instead represent structures that serve primarily to, e.g., maintain a desired planarity for a layer in the resulting circuit.

Figure 4:
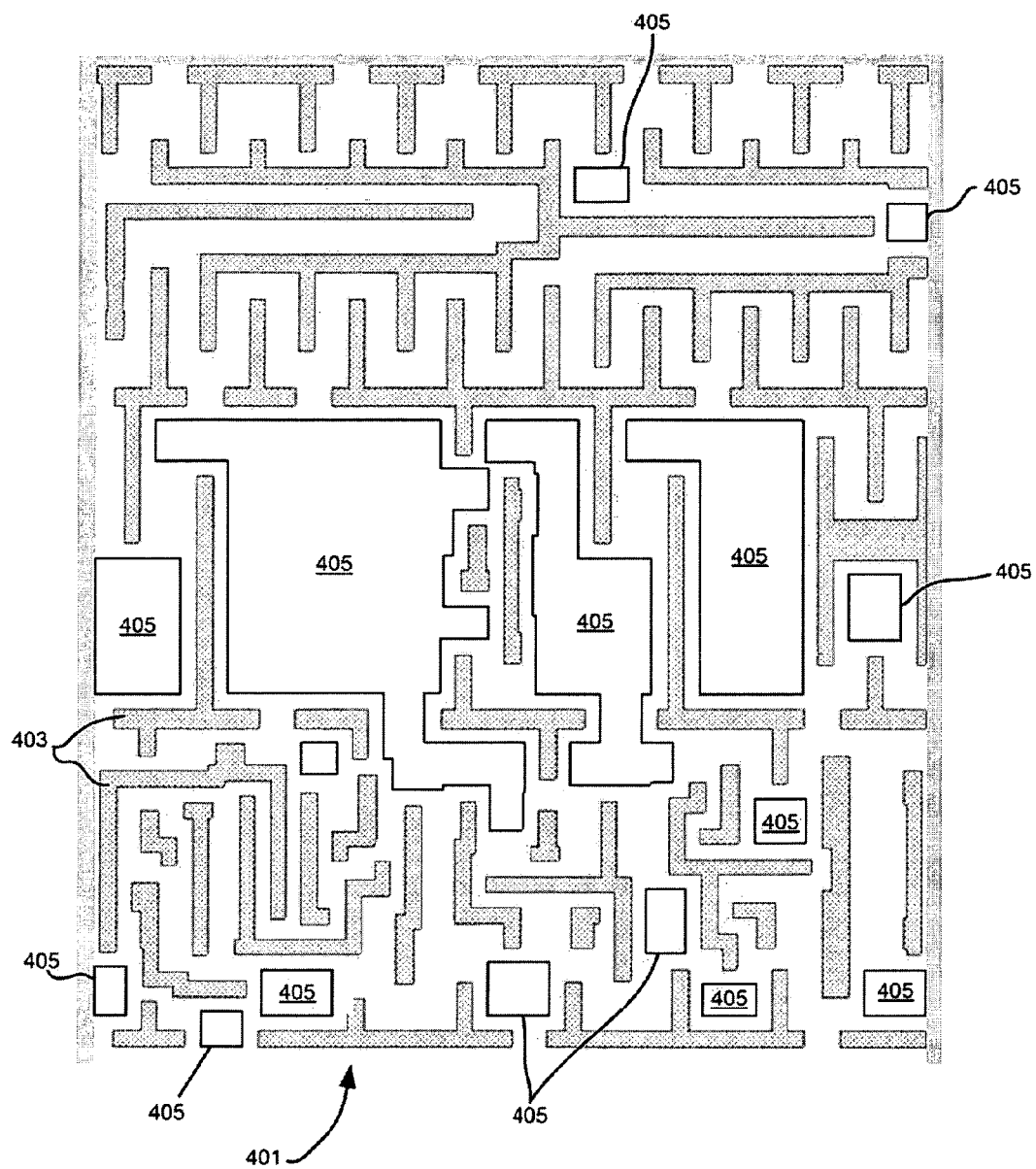
FIG. 4 illustrates an example of fill regions that may be identified in a layout circuit design according to various examples of the invention.

FIG. 4 illustrates an example of a layout circuit design 401 that includes several different functional polygons 403. As seen in this figure, there are empty areas between the functional polygons 403. As known in the art, the fill region identification module 205 analyzes these empty areas, to identify portions of these areas that will be suitable fill regions. For example, a user may specify that the perimeter of a fill region must be a threshold distance away from any adjacent functional polygons. Based upon the specified parameters for generating fill regions, the fill region identification module 205 will identify and designate portions of the empty areas as fill regions. For example, area portions 405 shown in FIG. 4 may be designated as fill regions. Various implementations of the invention may allow a user to specify any desired criteria for defining fill regions, such as a minimum area requirement, minimum dimensions requirements in one or two directions, a specified threshold distance away from other fill regions, etc.

With various embodiments of the invention, the fill region identification module 205 may concurrently identify the fill regions for each relevant layer described in a circuit design. Still other embodiments of the invention, however, may identify the fill regions for each relevant layer described in a circuit design separately. For example, some embodiments of the invention may identify the fill regions in a circuit design layer only after the fill regions of a previous layer in the circuit design have been identified and filled with fill polygons.

Determining Fill Pattern Positions in a First Layer

Figure 5:
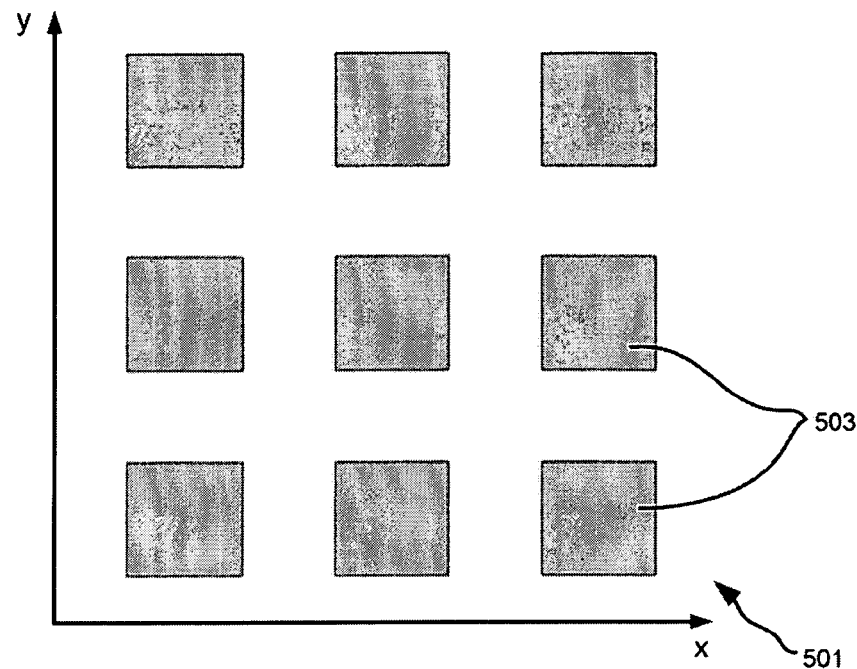
FIGS. 5 and 6 illustrate examples of patterns of fill polygons representing fill structures that may be employed according to various examples of the invention.

Once the fill region identification module 205 has identified the fill regions, in step 303 the fill structure addition module 209 adds data (e.g., polygon data) representing fill structures to the circuit data for a first layer in the circuit. With various implementations of the invention, the fill structure addition module 209 may add data to a circuit design that represents fill polygons arranged in a pattern. For example, the fill structure addition module 209 may add an array of fill polygons to each identified fill region. FIG. 5 illustrates one example of a fill polygon array 501 (or some portion of a fill polygon array) including fill polygons 503. In the array 501, the fill polygons 503 extend in two orthogonal directions substantially parallel to the plane of the layer in which they are placed (corresponding to the x-axis direction and the y-axis direction shown in FIG. 5 for ease of reference). Each fill polygon 503 has a square shape or "footprint." Further, the fill polygons 503 have a regular spacing between them in both the x-axis direction and the y-axis direction.

Figure 6:
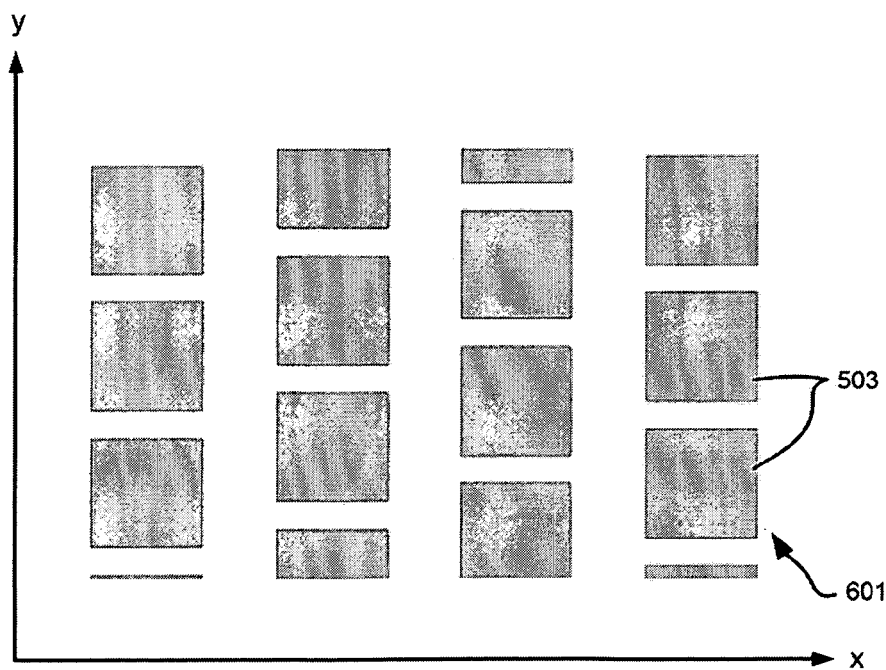

It should be appreciated, however, that various implementations of the fill structure addition module 209 may add fill polygons 503 in any desired arrangement. For example, the fill polygons 503 may have a different spacing in the x-axis direction than in the y-axis direction, as illustrated by the array 601 in FIG. 6. Alternately or additionally, the pitch of one or more rows or columns of the array may be out of phase with the pitch of one or more of its other rows or columns, as also illustrated in FIG. 6. Still further, the fill polygons may include rectangular polygons, hexagonal polygons, octagonal polygons, or polygons of any desired shape, including irregularly shaped polygons. Also, the size of the pattern may vary. For example, with some implementations of the invention, the pattern may include a fixed number of fill polygons (e.g., a 2×2 array of fill polygons, a 4×4 array of fill polygons, a 4×12 array of fill polygons, etc.). Alternately, the fill structure addition module 209 may automatically extend a pattern of fill polygons in the x-axis direction, the y-axis direction, or both, as the size of the fill region allows.

With various examples of the invention, the fill structure addition module 209 may attempt to place the fill polygons so as to maximize the number of fill polygons within the fill regions. That is, for each fill region 405, the fill structure addition module 209 may determine a placement for the pattern of fill polygons that seems to best maximize the area of the fill polygons that will fit into the fill region. It should be appreciated that, with some implementations of the inventions, the pattern may not be limited to entire fill polygons, but also may include only portions of fill polygons where space does not permit the placement of entire fill polygons. In addition to placement techniques that maximize the area of the fill polygons fitting into a fill region, some embodiments of the invention may alternately or additionally employ other fill techniques. For example, some implementations of the fill structure addition module 209 may allow a user to designate an amount of the fill regions (e.g., 45%) that should be filled with fill polygons, and place the pattern of fill polygons within the fill regions accordingly. A variety of still other fill polygon placement criteria will be apparent to those of ordinary skill in the art, and thus will not be discussed in more detail here.

The fill structure addition module 209 may use a simple effort-based technique to determine the placement of a fill polygon pattern in a fill region. With this technique, a user specifies an "effort" parameter to describe the amount of effort that the user wishes the fill structure addition module 209 to expend in placing the fill polygon pattern. If the value of the effort parameter is greater than "1," then the fill structure addition module 209 will attempt to place a reference point for the fill polygon pattern, such as a corner of the pattern, at that number of different locations in the fill region, to determine a location that will fill the relevant fill region 405 with the largest area of the fill polygons.

For example, if the value of the effort parameter is "5," then the fill structure addition module 209 will place the fill polygon pattern using an initial location value and four offset location values, to determine which corresponding location will fill the fill region 405 with the largest area of fill polygons. With some examples of the invention, each location value may be a single location. With still other examples of the invention, however, each location value may be the value of a single coordinate describing a location. Thus, with these embodiments of the invention, selecting an effort parameter of "5" will cause the fill structure addition module 209 to attempt to place the reference point for the fill polygon pattern at 25 different actual locations (i.e., using all possible combinations of 5 different x-coordinate values and 5 different y-coordinate values). If two or more different placement locations for a pattern's reference point will fill a fill region 405 with the largest area of fill polygons, then the fill structure addition module 209 may, for example, select a location for the pattern that will best center the fill polygons inside of the fill regions.

Of course, there are a variety of alternate placement algorithms that are well known in the art, many of which are more sophisticated than the effort technique described above. It should be appreciated that alternate embodiments of the invention may employ any desired placement algorithm to place the fill polygon pattern within the fill regions, such as linear optimization algorithms, simulated annealing algorithms, Monte Carlo algorithms and the like.

Figure 7:
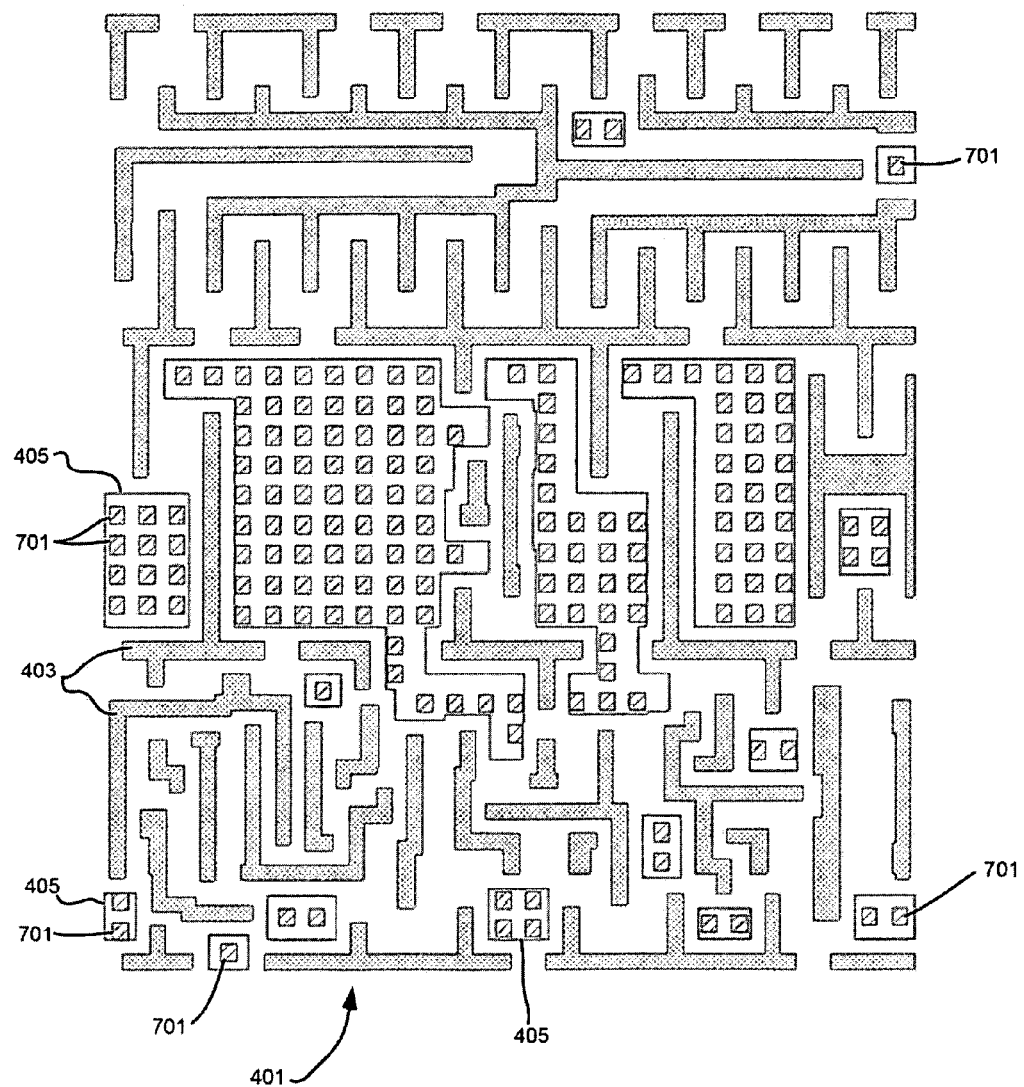
FIG. 7 illustrates an example of the addition of fill polygons to the layout circuit design that may be implemented according to various examples of the invention

FIG. 7 illustrates an example of how the fill regions 405 (originally shown in FIG. 4) may be filled with a pattern of fill polygons 701 according to various examples of the invention. As seen in this figure, this pattern of fill polygons used in this example is a regular array of square-shaped fill polygons 701, like that illustrated in FIG. 5.

Determining Fill Pattern Positions in a Second Layer

Once data representing a pattern of fill structures has been added to the circuit design for one layer of a circuit, the fill creation tool 201 will then add data representing a pattern of fill structures to the circuit design for a second layer of the circuit that is adjacent to the first layer. As will be appreciated by those of ordinary skill in the art, interconnect capacitance is conventionally associated with interconnect structures formed on a layer of conductive material, such as metal. The first layer receiving the fill structures thus typically will be a layer of conductive material (e.g., a metal layer), while the second layer receiving the fill structures also will be a layer of conductive material separated from the first layer of conductive material by at least one other layer of non-conductive material (e.g., a third layer of dielectric or resistive material). Accordingly, the term "adjacent layers" as used herein is intended to encompass layers of material that are not necessarily contiguous, but may be separated by one or more intermediate layers.

As noted above, various embodiments of the invention add the data representing the pattern of fill structures to the design for the second layer such that, when the circuit is manufactured, the pattern of fill structures in the second layer will be offset from the pattern of fill structures in the first layer in a direction substantially parallel to both layers. Accordingly, in step 305, the fill offset determination module 207 determines an offset for the pattern of fill polygons that will be added to the circuit design for a second layer adjacent to the first layer. More particularly, the fill offset generation module 207 will select an offset for the pattern of fill polygons in the second layer that will reduce or minimize their overlap with the fill polygons in the first layer along a direction substantially perpendicular to both layers. The selection of the offset will be discussed in more detail with reference to FIGS. 8A-9E.

Figure 8A:
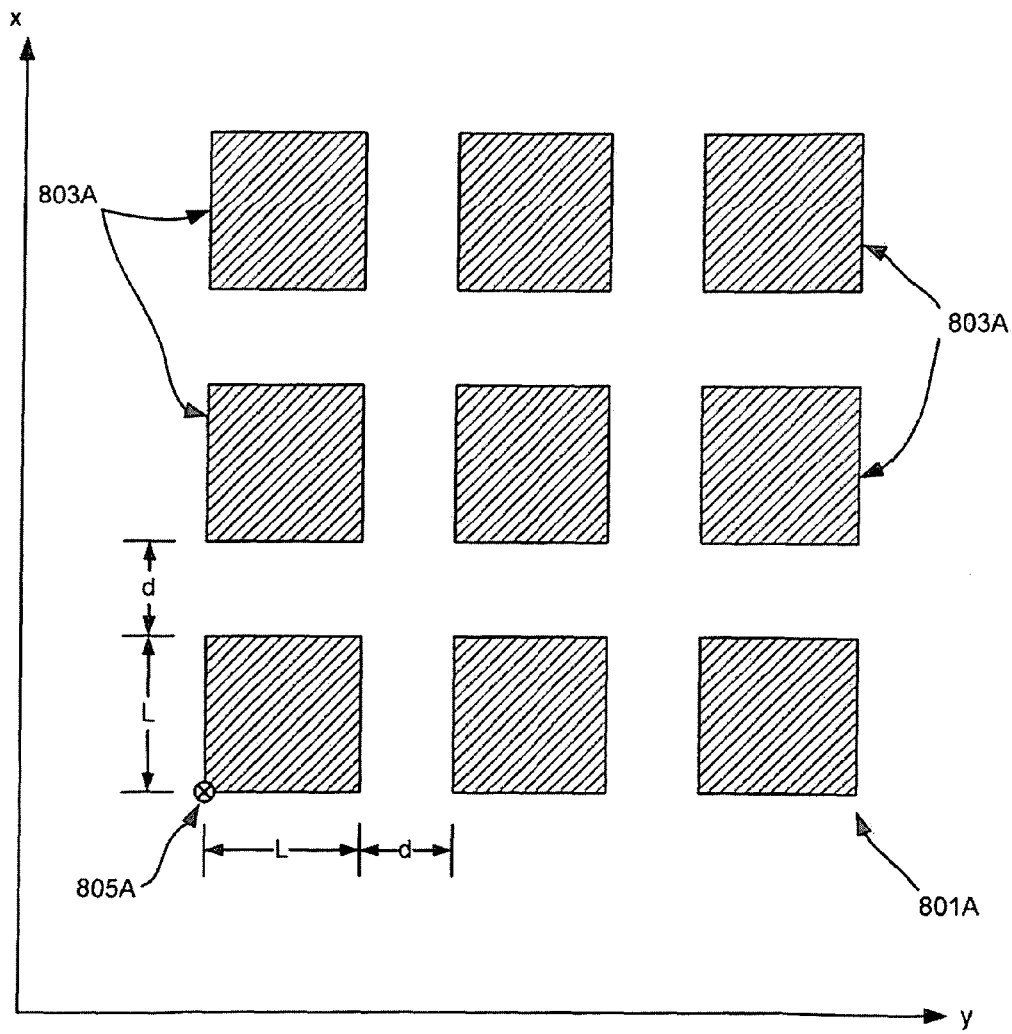
FIGS. 8A and 8B illustrate examples of patterns of fill polygons that may be employed according to various examples of the invention.
Figure 8B:
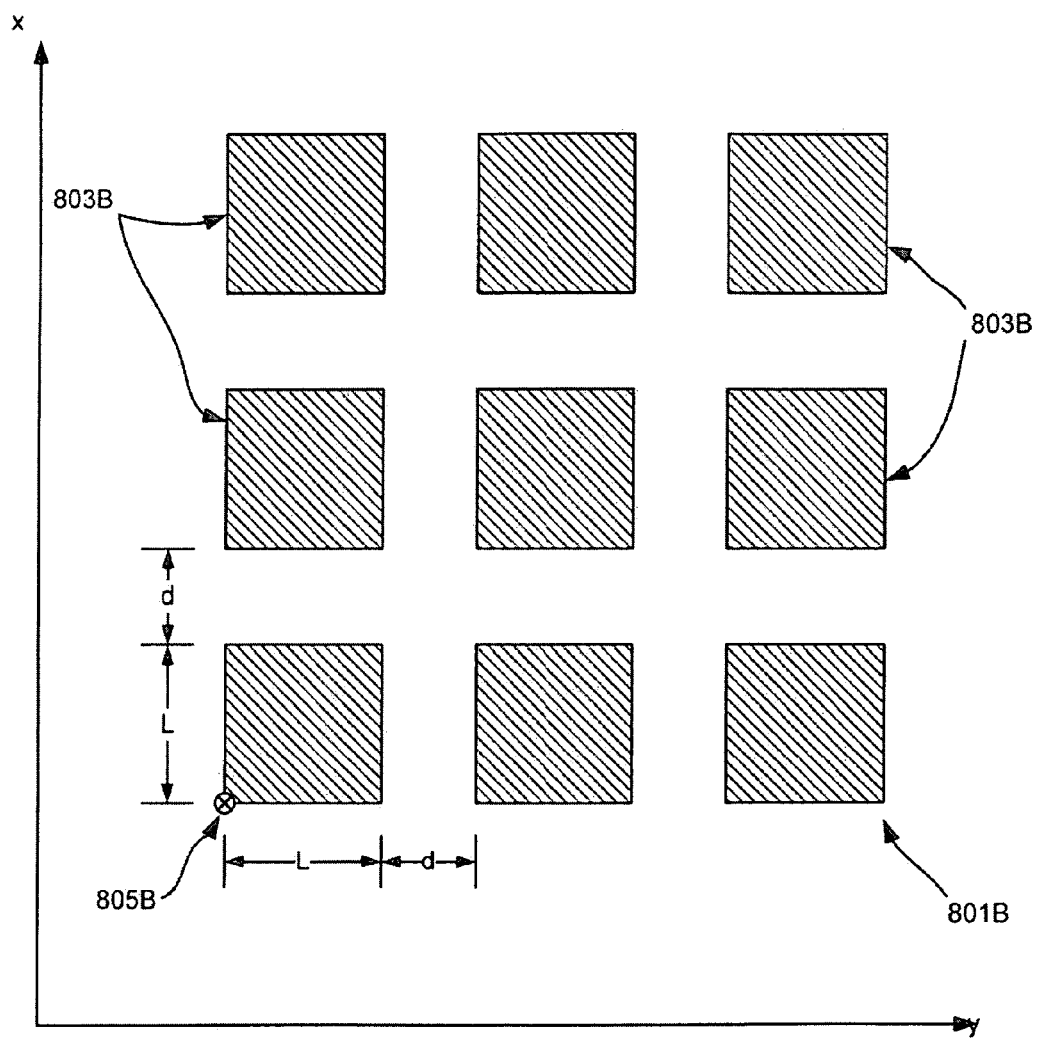

FIG. 8A shows a pattern 801A of fill polygons 803A that may be added to the data describing a first layer in a circuit design, while FIG. 8B illustrates a pattern 801B of fill polygons 803B that may be added to the data describing a second layer in a circuit design adjacent to the first layer. Each fill polygon 803A has a square footprint, with a height L (in the x-axis direction shown in FIG. 8A) and a length L (in the y-axis direction shown in FIG. 8A). Further, the pattern 801A provides a spacing of distance d between each fill polygon 803A in two orthogonal directions (i.e., the x-axis direction and the y-axis direction shown in FIG. 8A).

A reference point 805A associated with the pattern 801A also is shown in FIG. 8A. In this example, the reference point 805A is included in FIGS. 8A-9E to graphically illustrate in the following description how an offset may be provided between patterns 801A and 801B. As will be appreciated by those of ordinary skill in the art, however, it may be more convenient for the fill structure addition module 209 to assign the pattern 801A a desired position in a fill region using a single reference point rather than by using a plurality of different types of reference values (e.g., coordinate values vector values, etc.) Accordingly, while reference point 805A is illustrated in FIG. 8A for reference purposes only, various implementations of the invention may determine the position of a pattern of fill polygons in the design of a circuit layer using a reference point, such as the reference point 805A.

In FIG. 8A, the reference point 805A is shown as the point on the pattern 801A with the lowest x-axis direction and y-axis direction coordinate values. A point relative to the pattern 801A may be selected as the reference point 805A, however. For example, the reference point 805A may alternately be designated as the point with the highest x-axis direction and lowest y-axis direction coordinate values, the point with the highest x-axis direction and highest y-axis direction coordinate values, the point with the lowest x-axis direction and highest y-axis direction coordinate values, any other point within the pattern 801A, or even a point outside of the perimeter of the pattern 801A.

In this example, the pattern 801B shown in FIG. 8B is the same as the pattern 801A. That is, like the pattern 801A shown in FIG. 8A, each fill polygon 803B has a square footprint, with a height L (in the x-axis direction shown in FIG. 8B) and a length L (in the y-axis direction shown in FIG. 8B). Further, the pattern 801B also provides a spacing of distance d between each fill polygon 803B in two orthogonal directions (the x-axis direction and the y-axis direction shown in FIG. 8B). Also, like the pattern 801A, the pattern 801B includes a reference point 805B shown for graphically illustrating the offset that may be provided between pattern 801A and pattern 801B.

As previously noted, it may be more convenient for the fill structure addition module 209 to locate a fill pattern, such as the pattern 801B, at a desired position in a fill region using a single reference point rather than by using a plurality of different types of reference values (e.g., coordinate values vector values, etc.) Accordingly, it should be appreciated that, while reference point 805B is illustrated in FIG. 8B for reference purposes only, various implementations of the invention may determine the position of a pattern of fill polygons in a design using any arbitrary point for referencing the pattern 801B. If a reference point, such as reference point 805B, is used by the fill structure addition module 209 to locate a fill pattern at a desired position in a fill region, it may employ any reference point relative to the fill pattern.

Figure 9A:
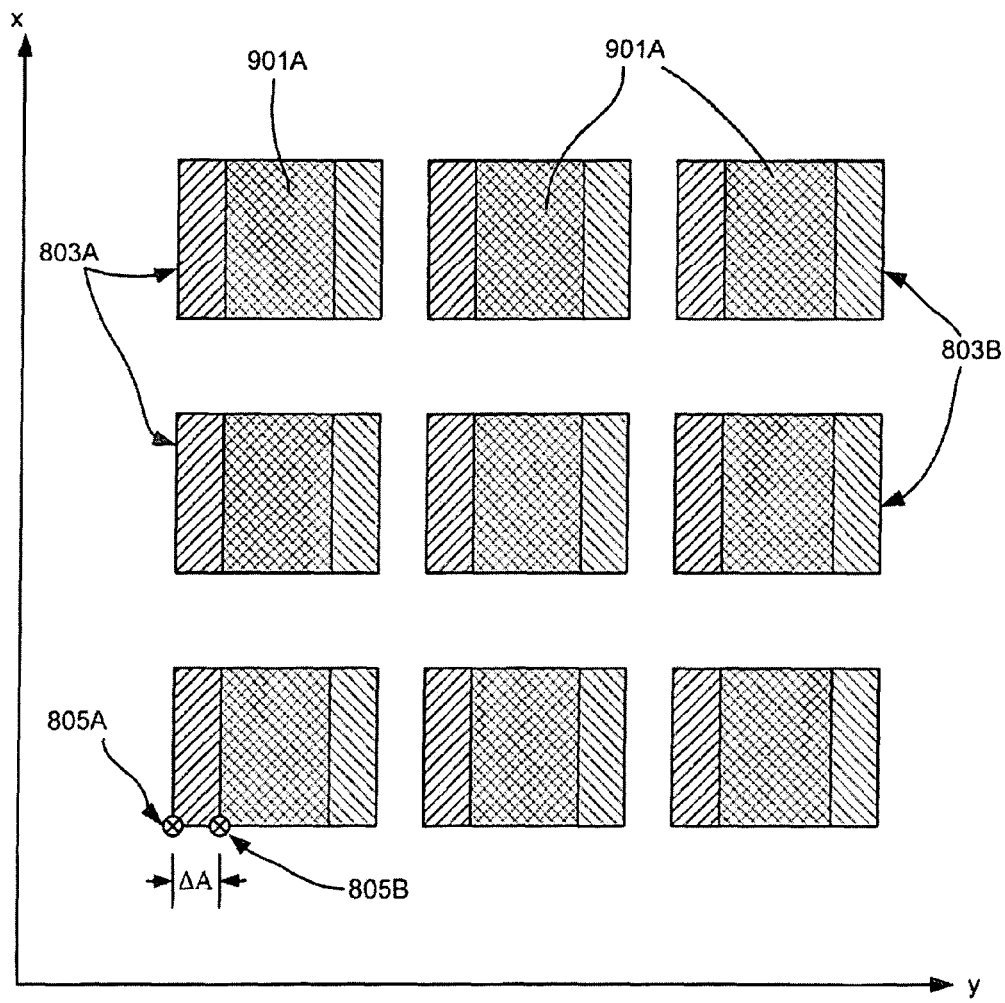
FIGS. 9A-9E schematically illustrate a representation of offsets between patterns of fill polygons in layers of a circuit in a layout circuit design.

When fill structures are manufactured in the second layer of the circuit device from the fill pattern 801B, they may overlap the fill structures manufactured in the first layer of the circuit device from the fill pattern 801A in a direction substantially perpendicular to both layers. Of course, the amount of this overlap in the physical circuit, if any, will primarily be determined by the overlap of the fill pattern 801B with the overlap of the fill pattern 801A in the circuit design. FIG. 9A schematically illustrates one example of how the fill polygons 803B in the second layer of the design might be arranged to overlap the fill polygons 803A in the first layer of the design. As seen in this figure, the patterns 801A and 801B are positioned so that the reference point 805B has an offset ΔA from the reference point 805A in a direction substantially parallel to both layers. In the illustrated example, the offset ΔA is in the y-axis direction shown in FIG. 9A. This offset ΔA creates an overlap region 901A for each pair of overlapping fill polygons 803A and 803B along a direction substantially parallel to both layers (i.e., along a z-axis direction relative to the x-axis and y-axis directions shown in FIG. 9A).

Figure 9B:
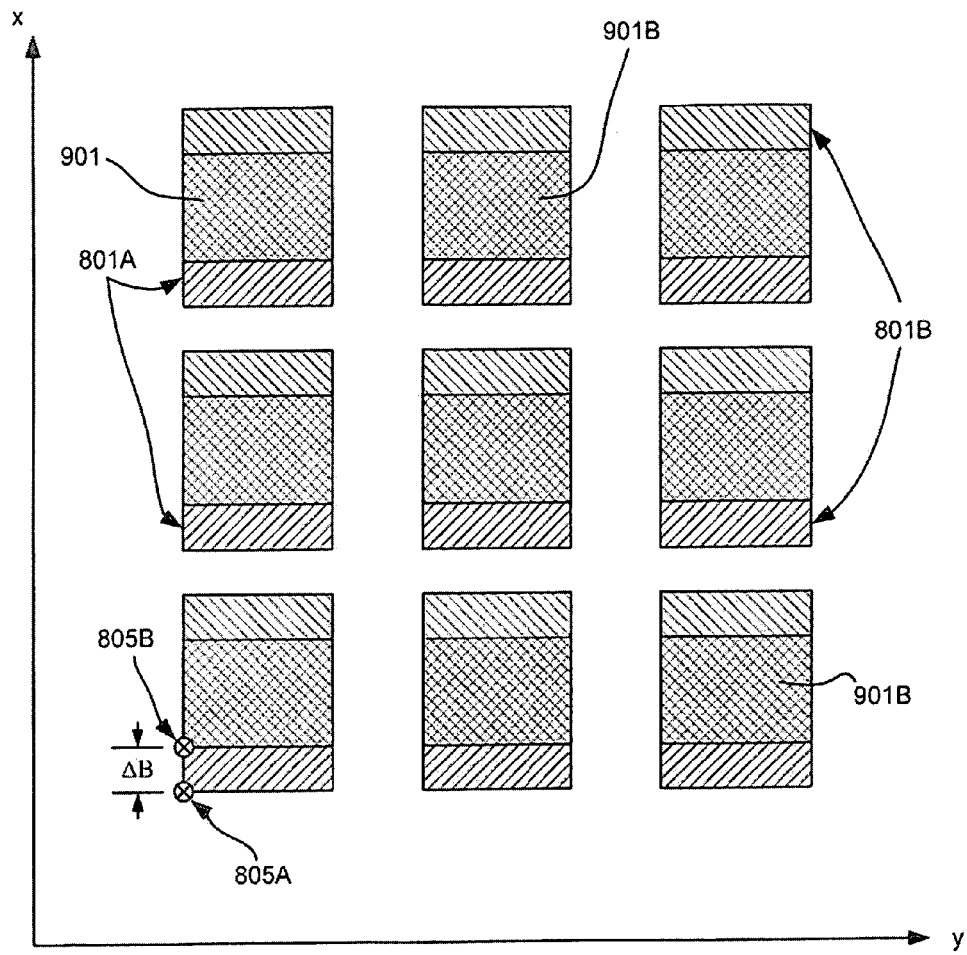

FIG. 9B schematically illustrates another example of how the fill polygons 803B in the second layer of the design might be positioned to overlap the fill polygons 803A in the first layer of the design. Like the example shown in FIG. 9A, in FIG. 9B the patterns 801A and 801B are positioned so that the reference point 805B has an offset ΔB from the reference point 805A in a direction substantially parallel to the planes of both layers. In the example illustrated in FIG. 9B, however, the offset ΔB is in the x-axis direction. Again, this offset ΔB creates an overlap region 901B for each pair of overlapping fill polygons 803A and 803B along a direction substantially parallel to both layers (i.e., along a z-axis direction relative to the x-axis and y-axis directions shown in FIG. 9A).

Figure 9C:
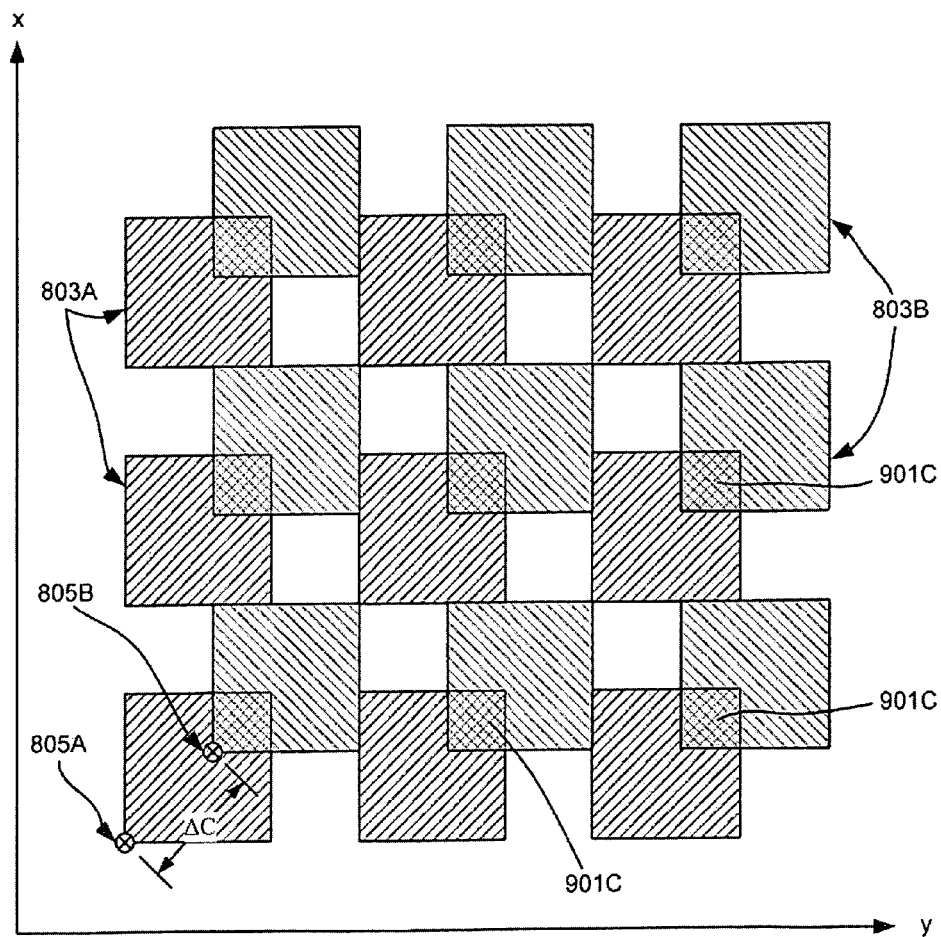

FIG. 9C schematically illustrates still another example of how the fill polygons 803B in the second layer of the design could be positioned to overlap the fill polygons 803A in the first layer of the design. In this figure, the patterns 801A and 801B are positioned so that the reference point 805B has an offset ΔC from the reference point 805A in a direction substantially parallel to both layers. In the example illustrated in FIG. 9C, however, the offset ΔC has components in the both the x-axis direction and the y-axis direction. More particularly, the offset ΔC has equal components in the both the x-axis direction and the y-axis direction. It should be appreciated, however, that with still other examples, the x-axis direction component and the y-axis direction component of the offset ΔC could be unequal. As seen in FIG. 9C, this offset ΔC creates an overlap region 901C for each pair of overlapping fill polygons 803A and 803B along a direction substantially parallel to both layers (i.e., in the z-axis direction relative to the x-axis and y-axis directions shown in FIG. 9C).

Figure 9D:
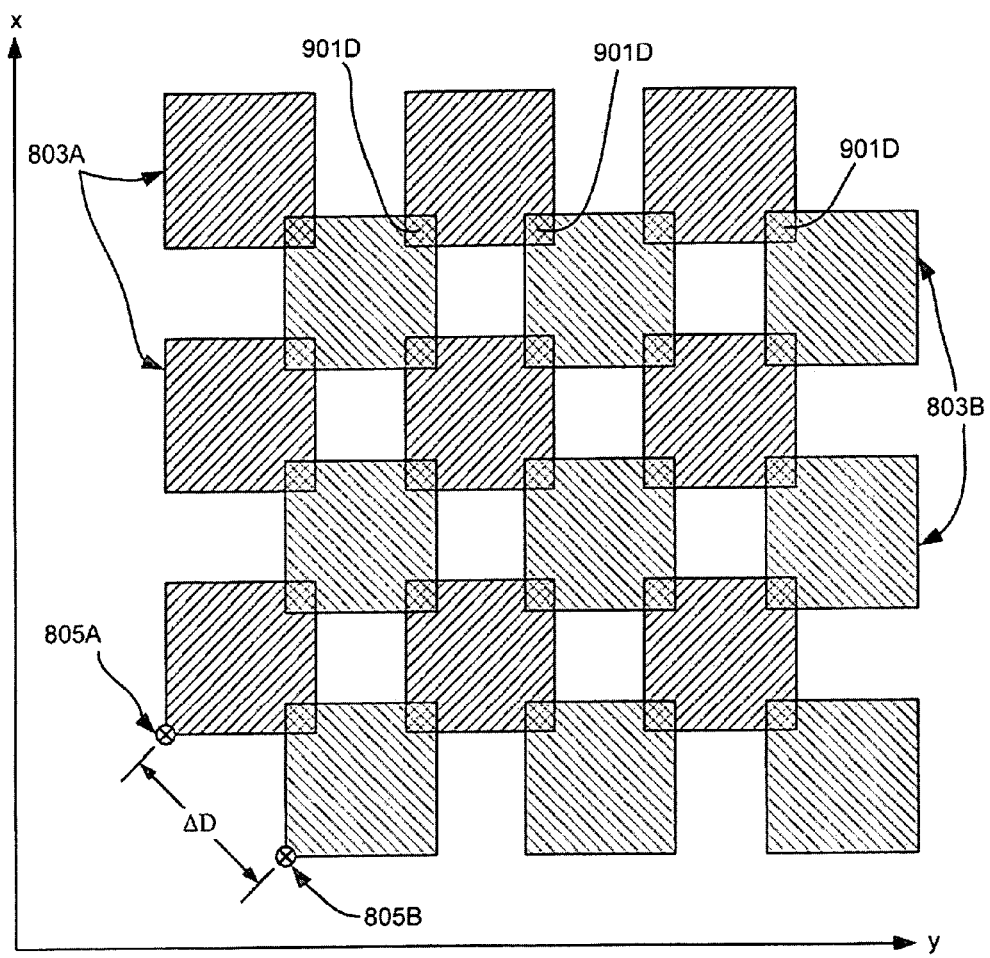

FIG. 9D schematically illustrates yet another example of how the fill polygons 803B in the second layer of the design might be positioned to overlap the fill polygons 803A in the first layer of the design. In this figure, the patterns 801A and 801B are positioned so that the reference point 805B has an offset ΔD from the reference point 805A in a direction substantially parallel to both layers. As seen in FIG. 9C, this offset ΔD causes one or more of the fill polygon 803A to overlap with multiple fill polygons 803B, and vice versa. Thus, for the patterns 801A and 801B, the offset ΔD creates overlap regions 901D for overlapping fill polygons 803A and 803B along a direction substantially parallel to both layers (i.e., in the z-axis direction relative to the x-axis and y-axis directions shown in FIG. 9D).

Figure 9E:
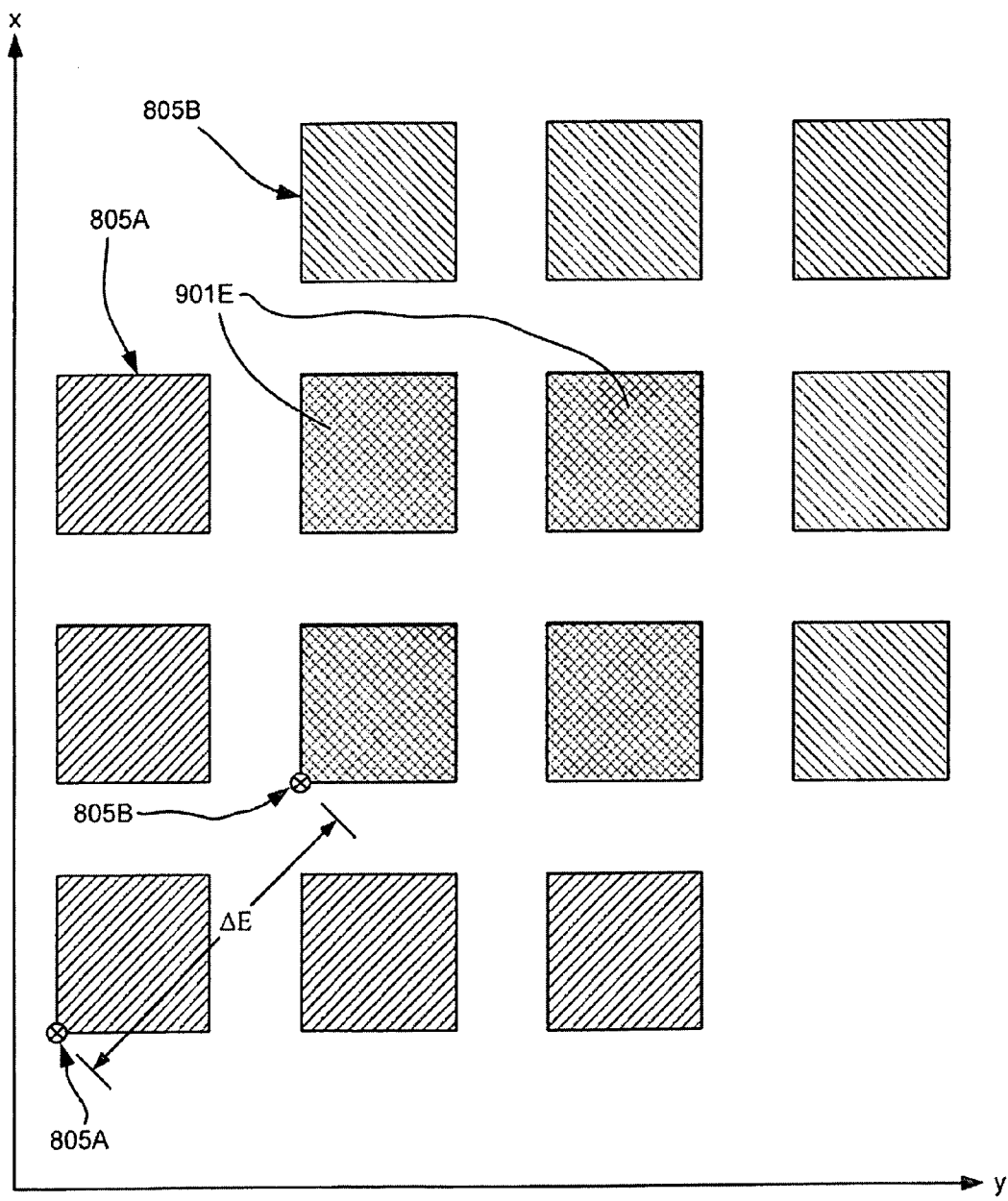

FIG. 9E schematically illustrates still yet another example of how the fill polygons 803B in the second layer of the design might be positioned to overlap the fill polygons 803A in the first layer of the design. In this figure, the patterns 801A and 801B are positioned so that the reference point 805B has an offset ΔE from the reference point 805A in a direction substantially parallel to both layers. In the example illustrated in FIG. 9E, the offset ΔE has equal components in the both the x-axis direction and the y-axis direction. As seen in FIG. 9E, this offset ΔD creates an overlap region 901E for each pair of overlapping fill polygons 803A and 803B along a direction substantially parallel to both layers (i.e., in the z-axis direction relative to the x-axis and y-axis directions shown in FIG. 9C). Moreover, the overlap region 901E for each pair of overlapping fill polygons 803A and 803B is entirely coextensive with each fill polygon 803A and 803B along a direction substantially parallel to both layers (i.e., in the z-axis direction relative to the x-axis and y-axis directions shown in FIG. 9D).

From the foregoing examples, it will be apparent that the amount of overlap between the fill polygons 803A of pattern 801A in a first layer and the fill polygons 803B of pattern 801B in a second layer (i.e., the area of regions 901) can be controlled by determining an offset between the patterns 801A and 801B in a direction substantially parallel to the layers. With various examples of the invention, the fill offset generation module 207 will select an offset for the fill polygon patterns of adjacent layers in order to control the amount of overlap between the patterns. As will be explained in more detail below, the fill offset generation module 207 will select an offset for the fill polygon patterns of adjacent layers to control the amount of capacitance that will be created by fill structures manufactured from the fill polygon patterns. For example, with some embodiments of the invention, the fill offset generation module 207 will determine an offset between the fill polygons of adjacent layers that will reduce or even minimize the capacitance between those layers.

Figure 10:
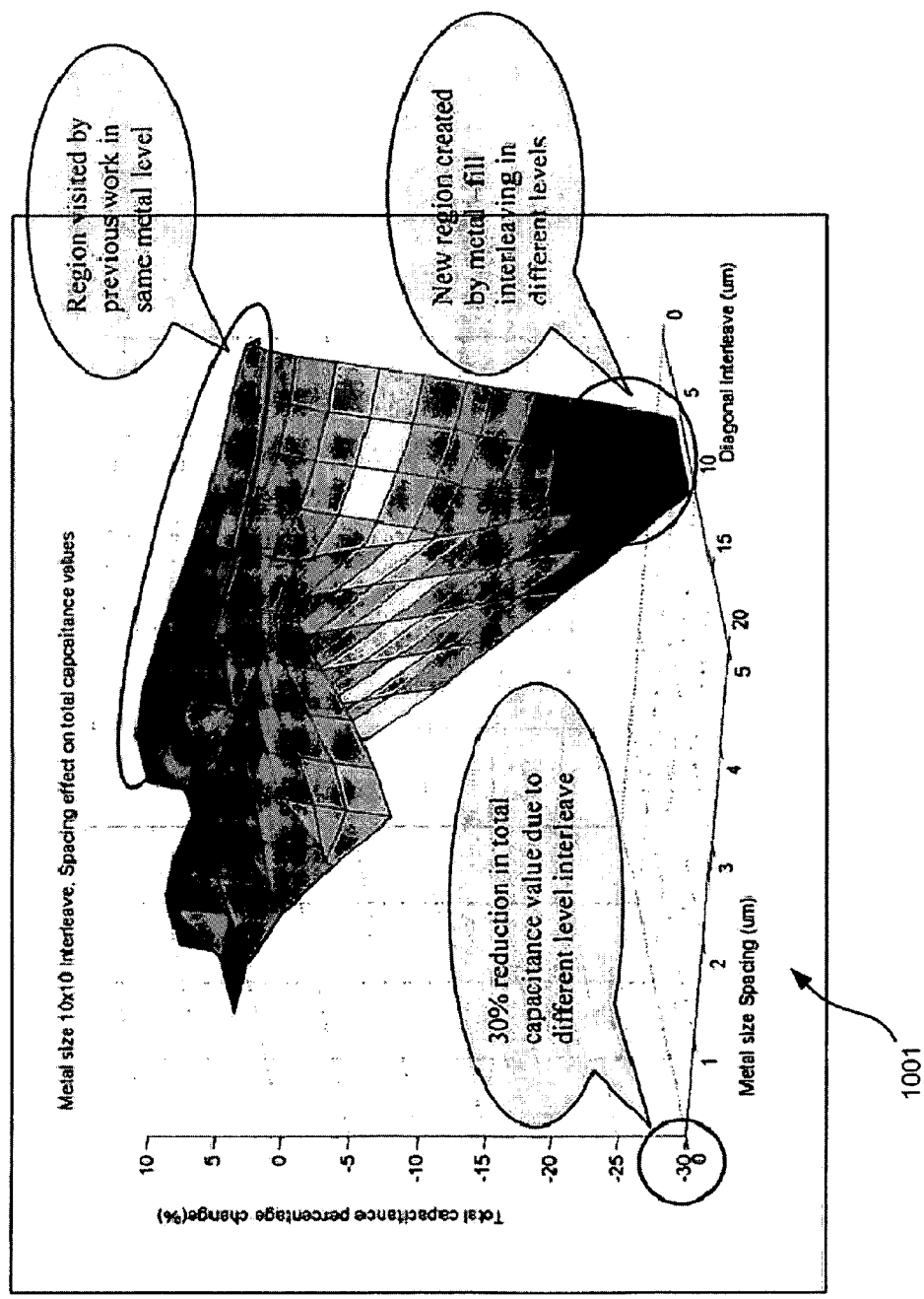
FIGS. 10-12 illustrate charts showing a change in total capacitance percentage relative to the spacing between fill structures in a pattern and to an offset between fill structures in adjacent layers of a circuit device.

FIG. 10 illustrates a capacitance graph 1001 showing how the selection of an offset between fill patterns on adjacent layers can control the total interconnect capacitance of those layers. The capacitance chart 1001 illustrates the use of fill patterns made up of fill polygons having dimensions of 10 μm×10 μm. More particularly, for fill polygons having dimensions of 10 μm×10 μm, the graph plots the total interconnect capacitance change of one of the layers against the spacing (in micrometers (μm)) between the fill polygons and also against the distance (in micrometers (μm)) of a diagonal offset or "interleave" between the patterns on adjacent layers. As seen in this figure, for a fill pattern with a spacing of approximately 5 μm between fill polygons, by selecting a diagonal offset (i.e., equal offset components in both the x-axis direction and the y-axis direction) of approximately 5 μm-10 μm, the fill creation tool 201 can reduce the amount of capacitance by approximately 30%.

Figure 11:
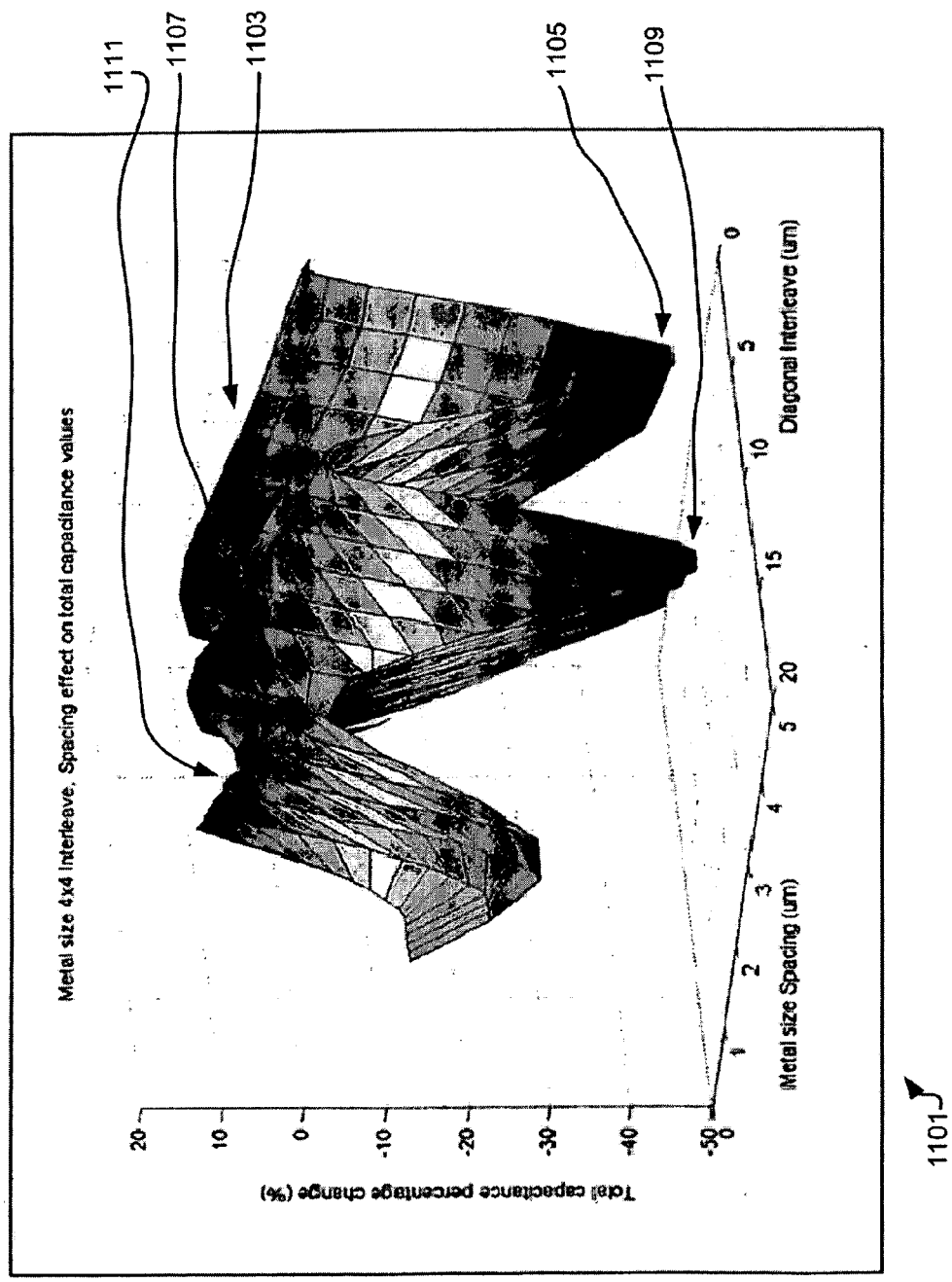

FIG. 11 illustrates yet another capacitance graph showing how the selection of an offset between fill patterns on adjacent layers can control the total interconnect capacitance of those layers. The capacitance chart 1101 illustrates the use of fill patterns made up of fill polygons having dimensions of 4 μm×4 μm. Again, the graph plots the total interconnect capacitance change of one of the layers against the spacing (in micrometers (μm)) between the fill polygons and against the distance (in micrometers (μm)) of a diagonal offset or "interleave" between the patterns on adjacent layers. The chart 1101 shows three maximum capacitance change regions and two minimum capacitance change regions. As seen in this figure, each of the maximum capacitance change regions occurs where the offset between the polygon fill patterns causes the fill polygons to overlap entirely. On the other hand, each of the minimum capacitance change regions occurs where the offset between the polygon fill patterns minimizes the amount of overlap between the patterns.

For example, the first maximum capacitance change region 1103 occurs where the offset is zero. With this offset, each fill polygon in the second layer exactly overlaps a corresponding fill polygon in the first layer. As the offset is increased, the amount of overlap between the pattern in the first layer and the pattern in the second layer decreases. As shown in chart 1101, the total interconnect capacitance change likewise decreases. The first minimum capacitance change region 1105 then occurs when the offset minimizes the amount of overlap between fill polygons in the first layer and fill polygons in the second layer. (See, for example, FIG. 9C.)

As the offset continues to increase, the amount of overlap between the pattern in the first layer and the pattern in the second layer then begins to increase. As shown in chart 1101, the total interconnect capacitance change correspondingly increases as well. When the offset increases to where each of its directional components (i.e., its x-axis direction component and its y-axis direction component) equals the sum of the length L of the fill polygons and the spacing d between fill polygons, then most of the fill polygons in the second layer will again completely overlap a corresponding fill polygon in the first layer, as shown in FIG. 9E. This offset corresponds to the second maximum capacitance change region 1107 shown in chart 1101.

Again, as the offset continues to increase, the amount of overlap between the pattern in the first layer and the pattern in the second layer then begins to decrease, resulting in a corresponding decrease in the total interconnect capacitance change as shown in chart 1101. When the offset is increased to where it again minimizes the amount of overlap between the pattern of fill polygons in the first layer and the pattern of fill polygons in the second layer, the capacitance change reaches the second minimum capacitance change region 1109 as shown in chart 1101. As the offset continues to increase, the amount of overlap between the pattern in the first layer and the pattern in the second layer begins to increase together with the capacitance change. Again, when the offset increases to where its causes the fill pattern in the second layer to coincide with the fill pattern in the first layer, the total interconnect capacitance change reaches the third maximum capacitance change region 1111.

Figure 12:
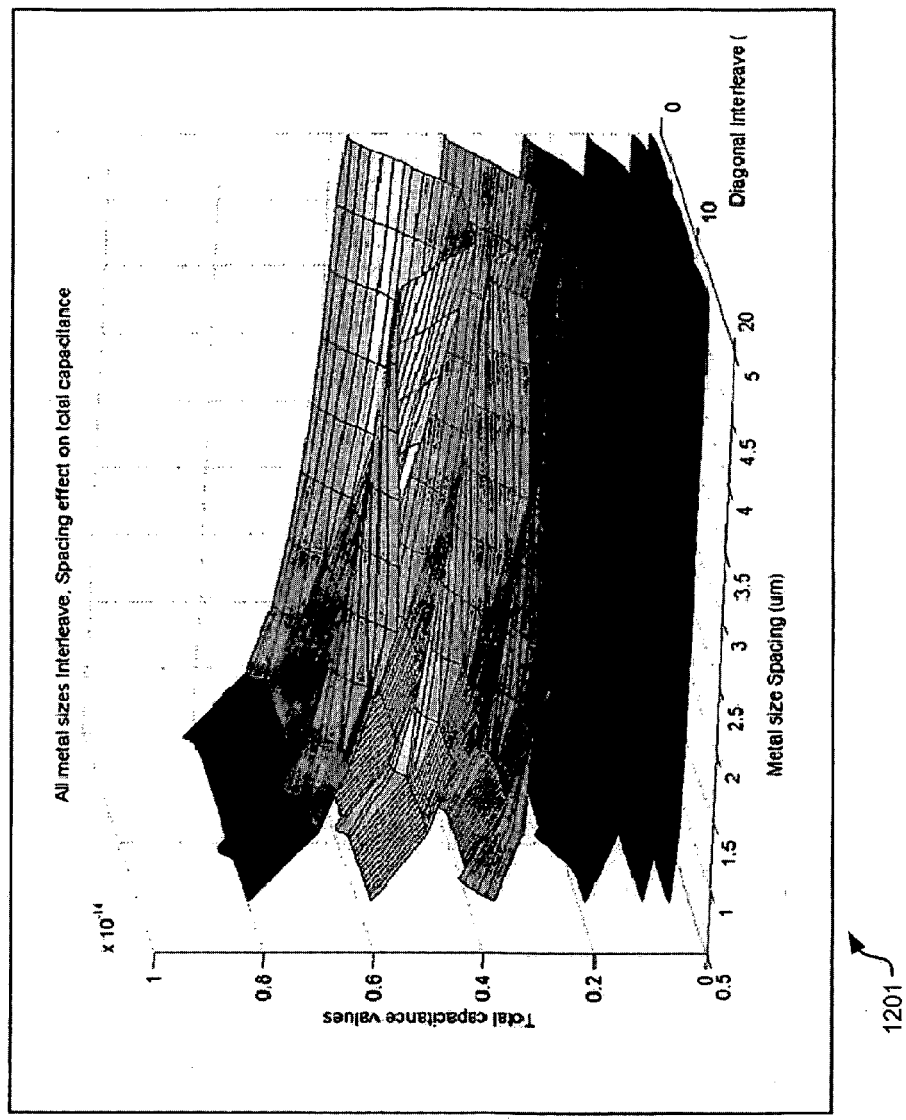

FIG. 12 illustrates yet another capacitance graph showing how the selection of an offset between fill patterns on adjacent layers can control the total interconnect capacitance of those layers. The capacitance chart 1201 illustrates the use of different fill patterns made up of square fill polygons having various dimensions. Again, the graph plots the total interconnect capacitance change of one of the layers against the spacing (in micrometers (μm)) between the fill polygons and against the distance (in micrometers (μm)) of a diagonal offset or "interleave" between the patterns on adjacent layers. Like the chart 1101, the chart 1201 shows how both maximum capacitance change regions and minimum capacitance change regions can be reached by varying the offset between the fill polygon patterns on adjacent layers. As seen in this figure, each of the maximum capacitance change regions occurs where the offset between polygon fill patterns causes individual fill polygons in one layer to overlap entirely with fill polygons in the other layer, while each of the minimum capacitance change regions occurs where the offset between polygon fill patterns minimizes the amount of overlap between the patterns.

Accordingly, in step 305, the fill offset determination module 207 determines an offset for the pattern of fill polygons for the second layer of the circuit design relative to the position of the pattern of fill polygons for the first layer of the circuit design, so as to obtain a desired total interconnect capacitance. Typically, the fill offset determination module 207 will determine an offset that will simply minimize the total interconnect capacitance associated with the layers. Under some circumstances, however, the fill offset determination module 207 may be configured to select an offset that will obtain a specific desired total interconnect capacitance. With these implementations of the invention, the fill offset determination module 207 may determine the appropriate offset using, for example, lookup tables, real-time calculations, or reference to graphs such as the graphs illustrated in FIGS. 10-12.

Also, while the offset will be in a direction substantially parallel to the plane of both the first layer and the second layer, both the length and direction of the offset may vary as desired and appropriate. For example, the fill polygons patterns 801A and 801B discussed above employ square fill polygons in arrays having equal spacing in both the x-axis direction and the y-axis direction. It therefore may be more convenient to use an offset with equal components in the x-axis direction and the y-axis direction. Various alternate implementations of the invention, however, may employ fill polygons having rectangular, pentagonal, or hexagonal shapes, or even irregular shapes. Further, with some fill patterns, the spacing between fill polygons may vary, both for spacing in the x-axis direction, spacing in the y-axis direction, and between individual fill polygons in either direction (e.g., an irregular pattern of fill polygons). Still further, the fill pattern for one layer may be different from the fill pattern for another layer. Accordingly, various implementations of the fill offset determination module 207 may determine both the direction and length of the offset based upon the particular fill patterns being employed.

Once the fill offset determination module 207 has determined an offset for the fill pattern to be added to the layout circuit design of the second layer, in step 307 the fill structure addition module 209 adds data representing the fill pattern to the layout circuit design of the second layer with the determined offset. The circuit then is subsequently manufactured with fill structures corresponding to the added fill polygons. If the circuit is, e.g., an integrated circuit, then the circuit may be manufactured with the fill structures using any conventional manufacturing process, such as a photolithographic process. It should be appreciated, however, that embodiments of the invention are not limited in application to integrated circuits. For example, some implementations of the invention may be employed to provide fill structures in printed circuit boards (PCBs).

Alternate Implementations

While several particular examples of the invention have been described in detail above, it should be appreciated that these examples have been provided for illustrative purposes only, and are not intended to be limiting. As will be appreciated from the foregoing description, various alternate embodiments of the invention also may be implemented. For example, while the foregoing description discusses creating fill structures to two adjacent layers in a circuit, it should be appreciated that various embodiments of the invention may be employed to create fill structures to any number of adjacent layers in a circuit device. For example, once a pattern offset has been selected for a second layer adjacent to a first layer, some implementations of the fill offset determination module 207 may be used to determine on offset as described above for fill polygons to be added to a third layer in a circuit design adjacent to the second layer. Similarly, the fill offset determination module 207 may then determine an offset as described above for fill polygons to be added to a fourth layer in a circuit design adjacent to the third layer, and so forth. With various implementations of the invention, the offset between the pattern of fill polygons in the third layer relative to the pattern of fill polygons in the second layer may be substantially an integral multiple of the offset between the pattern of fill polygons on the second and the pattern of fill polygons on the first layer, or vice versa.

Still further, some implementations of the invention may omit the fill region identification module 205 and the corresponding step of identifying fill regions in a circuit design. For example, the fill creation tool 201 may be configured to receive circuit designs containing fill regions that have already been identified by a separate fill region identification tool.

Also, while a specific order of steps has been described above with regard to various examples of the invention, it should be appreciated that different embodiments of the invention may perform one or more of these steps in an alternate order, perform one or more of these steps in parallel, or omit one or more of these steps altogether. For example, with some implementations of the invention, the fill structure addition module 209 may add data representing fill structures to the second layer of a circuit design only after it has already added data representing fill structures to the first layer of the circuit design. With still other implementations of the invention, however, the fill structure addition module 209 may wait until the fill offset determination module 207 has determined an offset, and then add data representing fill structures to both the first and second layers of a circuit design concurrently. Further, the fill structure addition module 209 may add data representing fill structures to the second layer of a circuit design before the fill offset determination module 207 determines an offset for the data, and then subsequently update the second layer of the circuit design to include the offset.

In addition, with some implementations of the invention, the fill offset determination module 207 may additionally determine the spacing (or spacings) between fill polygons for the one or both of the fill patterns added to the first and second circuit layers. As discussed in detail above, the offset between fill patterns in adjacent layers (and the corresponding overlap between those fill patterns) controls the total interconnect capacitance of the layers. As shown in FIGS. 10-12 above, however, the spacing between fill polygons, in conjunction with the offset between fill patterns in adjacent layers, also impacts the total interconnect capacitance of the layers. Accordingly, some implementations may additionally vary the spacing between fill polygons for the first layer, fill polygons for the second layer, or both, to obtain a desired total interconnect capacitance.

Still further, the fill structure addition module 209 may account for the offset determined by the fill offset determination module 207 when adding data representing fill structures to the first layer of a circuit design. For example, rather than determining a position of the fill pattern for the first layer that will maximize the fill density of that layer, the fill structure addition module 209 may instead postpone locating the fill pattern in the fill regions of the first layer until after the fill offset determination module 207 has determined the offset for the pattern of fill polygons to be added to the second layer. The fill structure addition module 209 may then determine a position for the patterns in both layers based upon the determined offset so that, for example, each layer will subsequently meet a minimum fill density requirement.

It also should be appreciated that, while various implementations of invention have been described with respect to the use of patterns of fill polygons, various embodiments of the invention may alternately or additionally be employed to add fill polygons to a circuit design on an individual basis. For example, the fill offset determination module 207 may determine an offset for each individual fill polygon to be added to the circuit design of the second layer based upon one or more individual fill polygons added to the circuit design of the first layer.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

What is claimed is:

1. A method of creating fill structures for an electronic device, comprising:
   employing a computer to determine a first reference position in a design of an electronic device for manufacturing a first pattern of fill structures in a first layer of material of the electronic device;
   employing a computer to determine a second reference position in the design of the electronic device for manufacturing a second pattern of fill structures in a second layer of material of the electronic device adjacent to the first layer of material, such that the second reference position has a predetermined offset from the first reference position in a direction that is substantially parallel to both the first layer of material and the second layer of material, the offset being based upon the second pattern of fill structures; and
   employing a computer to determine to add data representing the second pattern of fill structures to the electronic design based upon the second reference position.

2. The method recited in claim 1, further comprising
   employing a computer to determine a third reference position in the design of the electronic device for manufacturing a third pattern of fill structures in a third layer of material adjacent to the first layer of material, such that the third reference position has a second predetermined offset from the first reference position in a direction that is substantially parallel to both the first layer of material and the third layer of material, the offset of the third reference position being based upon the third pattern of fill structures; and
   employing a computer to add data representing the third pattern of fill structures to the electronic design based upon the third reference position.

3. The method recited in claim 2, wherein
   a distance of the offset of the second reference position is substantially an integral multiple of a distance of the offset of the third reference position, or
   the distance of the offset of the third reference position is substantially an integral multiple of the distance of the offset of the second reference position.

4. The method recited in claim 2, wherein the direction of the offset of the second reference position is substantially the same as the direction of the offset of the third reference position.

5. The method recited in claim 2, wherein
   a distance of the offset of the second reference position is substantially an integral multiple of a distance of the offset of the third reference position, or the distance of the offset of the third reference position is substantially an integral multiple of the distance of the offset of the second reference position, and
   the direction of the offset of the second reference position is substantially the same as the direction of the offset of the third reference position.

6. The method recited in claim 2, wherein the first pattern of fill structures, the second pattern of fill structures, and the third pattern of fill structures are a same pattern.

7. The method recited in claim 1, wherein the fill structures have a rectangular footprint.

8. The method recited in claim 7, wherein the fill structures have a square footprint.

9. The method recited in claim 1, wherein the first pattern of fill structures and the second pattern of fill structures each extends in a first pattern direction substantially parallel to both the first layer of material and the second layer of material and in a second pattern direction substantially orthogonal to the first pattern direction.

10. The method recited in claim 9, wherein each of the first pattern of fill structures and the second pattern of fill structures is an array having a regular spacing between fill structures in the first pattern direction.

11. The method recited in claim 9, wherein each of the first pattern of fill structures and the second pattern of fill structures is an array having a regular spacing between fill structures in the second pattern direction.

12. The method recited in claim 9, wherein each of the first pattern of fill structures and the second pattern of fill structures has a spacing between fill structures in the first pattern direction that is the same as a spacing between fill structures in the second pattern direction.

13. The method recited in claim 9, wherein the offset of the second pattern of fill structures is substantially in only the first pattern direction or substantially in only the second pattern direction.

14. The method recited in claim 9, wherein the offset of the second pattern of fill structures is in a direction having a first offset component in the first pattern direction and a second offset component in the second pattern direction.

15. The method recited in claim 14, wherein the second pattern of fill structures is substantially the same as the first pattern of fill structures.

16. The method recited in claim 15, wherein
   a length of each fill structure in the first pattern direction is greater than a spacing between fill structures in the first pattern direction, and
   the first offset component is substantially equal to or greater than the spacing between fill structures in the first pattern direction.

17. The method recited in claim 16, wherein the first offset component is less than or greater than a sum of the length of each fill structure in the first pattern direction with the spacing between fill structures in the first pattern direction.

18. The method recited in claim 15, wherein
   a length of each fill structure in the second pattern direction is greater than a spacing between fill structures in the second pattern direction, and
   the second offset component is substantially equal to or greater than a spacing between fill structures in the second pattern direction.

19. The method recited in claim 18, wherein the second offset component is less than or greater than a sum of the length of each fill structure in the second pattern direction and the spacing between fill structures in the second pattern direction.

20. The method recited in claim 1, wherein the offset minimizes overlap of fill structures in the first layer with fill structures in the second layer relative to a direction substantially perpendicular to the first layer and the second layer.

21. The method recited in claim 1, wherein the electronic device is an integrated circuit device or a printed circuit board.

22. A method for forming an electronic circuit device, comprising:
   forming a first pattern of fill structures in a first layer of material of an electronic device; and
   forming a second pattern of fill structures in a second layer of material of the electronic device adjacent to the first layer of material, such that the second pattern of fill structures has a predetermined offset from the first pattern of fill structures in a direction that is substantially parallel to both the first layer of material and the second layer of material, the offset being based upon the second pattern of fill structures.

23. The method recited in claim 22, further comprising forming a third pattern of fill structures in a third layer of material adjacent to the first layer of material, such that the third pattern of fill structures has a predetermined offset from the first pattern of fill structures in a direction that is substantially parallel to both the first layer of material and the third layer of material.

24. The method recited in claim 23, wherein
a distance of the offset of the second pattern of fill structures is substantially an integral multiple of a distance of the offset of the third pattern of fill structures, or
the distance of the offset of the third pattern of fill structures is substantially an integral multiple of the distance of the offset of the second pattern of fill structures.

25. The method recited in claim 23, wherein the direction of the offset of the second pattern of fill structures is substantially the same as the direction of the offset of the third pattern of fill structures.

26. The method recited in claim 23, wherein
a distance of the offset of the second pattern of fill structures is substantially an integral multiple of a distance of the offset of the third pattern of fill structures, or the distance of the offset of the third pattern of fill structures is substantially an integral multiple of the distance of the offset of the second reference position, and
the direction of the offset of the second reference position is substantially the same as the direction of the offset of the third reference position.

27. The method recited in claim 23, wherein the first pattern of fill structures, the second pattern of fill structures, and the third pattern of fill structures are a same pattern.

28. The method recited in claim 22, wherein the fill structures have a rectangular footprint.

29. The method recited in claim 28, wherein the fill structures have a square footprint.

30. A fill tool, comprising:
a fill analysis module configured to
receive an electronic device design including a plurality of layers,
analyze design data for a first layer of the electronic device to identify one or more fill regions to which data representing a first pattern of fill structures should be added, and
analyze design data for a second layer of the electronic device to identify one or more fill regions to which data representing a second pattern of fill structures should be added; and
a fill generation module configured to
insert data representing the first pattern of fill structures into the fill regions of the design data for the first layer of the electronic device, and
insert data representing the second pattern of fill structures into the fill regions of the design data for the second layer of the electronic device, such that the second pattern of fill structures will have a predetermined offset from the first pattern of fill structures in a direction that is substantially parallel to both the first layer of the electronic device and the second layer of the electronic device and with the offset being based upon the second pattern of fill structures.

31. The fill tool recited in claim 30, wherein
the fill analysis module is further configured to analyze design data for a third layer of the electronic device to identify one or more fill regions to which data representing a third pattern of fill structures should be added, and
the fill generation module is further configured to insert data representing the third pattern of fill structures into the fill regions of the design data for the third layer of the electronic device, such that the third pattern of fill structures will have a predetermined offset from the first pattern of fill structures in a direction that is substantially parallel to both the first layer of the electronic device and the third layer of the electronic device.

32. The fill tool recited in claim 31, wherein the fill generation module is configured to insert data representing the first pattern of fill structures and insert data representing the second pattern of fill structures such that
a distance of the offset of the second fill pattern is substantially an integral multiple of a distance of the offset of the third fill pattern, or
the distance of the offset of the third fill pattern is substantially an integral multiple of the distance of the offset of the second fill pattern.

33. The fill tool recited in claim 31, wherein the fill generation module is configured to insert data representing the first pattern of fill structures and insert data representing the second pattern of fill structures such that the direction of the offset of the second fill pattern is substantially the same as the direction of the offset of the third fill pattern.

34. The fill tool recited in claim 31, wherein the fill generation module is configured to insert data representing the first pattern of fill structures and insert data representing the second pattern of fill structures such that
a distance of the offset of the second fill pattern is substantially an integral multiple of a distance of the offset of the third fill pattern, or the distance of the offset of the third fill pattern is substantially an integral multiple of the distance of the offset of the second fill pattern, and
the direction of the offset of the second fill pattern is substantially the same as the direction of the offset of the third fill pattern.

35. The fill tool recited in claim 31, wherein the fill generation module is configured to insert data representing the first pattern of fill structures, insert data representing the second pattern of fill structures, and insert data representing the third pattern of fill structures such that the first pattern of fill structures, the second pattern of fill structures, and the third pattern of fill structures are a same pattern.

36. The fill tool recited in claim 30, wherein the fill generation module is configured to insert data representing the first pattern of fill structures and insert data representing the second pattern of fill structures such that the fill structures have a rectangular footprint.

37. The fill tool recited in claim 36, wherein the fill generation module is configured to insert data representing the first pattern of fill structures and insert data representing the second pattern of fill structures such that the fill structures have a square footprint.

38. The fill tool recited in claim 30, wherein the fill generation module is configured to insert data representing the first pattern of fill structures and insert data representing the second pattern of fill structures such that the first pattern of fill structures and the second pattern of fill structures each extends in a first pattern direction substantially parallel to both the first layer of material and the second layer of material and in a second pattern direction substantially orthogonal to the first pattern direction.

39. The fill tool recited in claim 38, wherein the fill generation module is configured to insert data representing the first pattern of fill structures and insert data representing the second pattern of fill structures such that each of the first pattern of fill structures and the second pattern of fill structures is an array having a regular spacing between fill structures in the first pattern direction.

40. The fill tool recited in claim 38, wherein the fill generation module is configured to insert data representing the first pattern of fill structures and insert data representing the second pattern of fill structures such that each of the first pattern of fill structures and the second pattern of fill structures is an array having a regular spacing between fill structures in the second pattern direction.

41. The fill tool recited in claim 38, wherein the fill generation module is configured to insert data representing the first pattern of fill structures and insert data representing the second pattern of fill structures such that each of the first pattern of fill structures and the second pattern of fill structures has a spacing between fill structures in the first pattern direction that is the same as a spacing between fill structures in the second pattern direction.

42. The fill tool recited in claim 38, wherein the fill generation module is configured to insert data representing the first pattern of fill structures and insert data representing the second pattern of fill structures such that the offset of the second pattern of fill structures is substantially in only the first pattern direction or substantially in only the second pattern direction.

43. The fill tool recited in claim 38, wherein the fill generation module is configured to insert data representing the first pattern of fill structures and insert data representing the second pattern of fill structures such that the offset of the second pattern of fill structures is in a direction having a first offset component in the first pattern direction and a second offset component in the second pattern direction.

44. The fill tool recited in claim 43, wherein the fill generation module is configured to insert data representing the first pattern of fill structures and insert data representing the second pattern of fill structures such that the second pattern of fill structures is substantially the same as the first pattern of fill structures.

45. The fill tool recited in claim 44, wherein the fill generation module is configured to insert data representing the first pattern of fill structures and insert data representing the second pattern of fill structures such that
a length of each fill structure in the first pattern direction is greater than a spacing between fill structures in the first pattern direction, and
the first offset component is substantially equal to or greater than the spacing between fill structures in the first pattern direction.

46. The fill tool recited in claim 45, wherein the fill generation module is configured to insert data representing the first pattern of fill structures and insert data representing the second pattern of fill structures such that the first offset component is less than or greater than a sum of the length of each fill structure in the first pattern direction with the spacing between fill structures in the first pattern direction.

47. The fill tool recited in claim 44, wherein the fill generation module is configured to insert data representing the first pattern of fill structures and insert data representing the second pattern of fill structures such that
a length of each fill structure in the second pattern direction is greater than a spacing between fill structures in the second pattern direction, and
the second offset component is substantially equal to or greater than a spacing between fill structures in the second pattern direction.

48. The fill tool recited in claim 47, wherein the fill generation module is configured to insert data representing the first pattern of fill structures and insert data representing the second pattern of fill structures such that the second offset component is less than or greater than a sum of the length of each fill structure in the second pattern direction and the spacing between fill structures in the second pattern direction.

49. The fill tool recited in claim 30, wherein the fill generation module is configured to insert data representing the first pattern of fill structures and insert data representing the second pattern of fill structures such that the offset minimizes overlap of fill structures in the first layer with fill structures in the second layer relative to a direction substantially perpendicular to the first layer and the second layer.

50. The fill tool recited in claim 30, wherein the electronic device is an integrated circuit device or a printed circuit board.

51. The fill tool recited in claim 30, further comprising a database configured to store the electronic device design.

52. A method of creating fill structures for an electronic device, comprising:
employing a computer to generate data representing a first pattern of fill structures for a design of a first layer of an electronic device;
employing a computer to generate data representing a second pattern of fill structures for a design of a second layer of the electronic device adjacent to the first layer of material, such that the second pattern of fill structures has a predetermined offset from the first pattern of fill structures in a direction that is substantially parallel to both the first layer and the second layer, the offset being based upon the second pattern of fill structures.

53. The method recited in claim 52, further comprising generating data representing a first pattern of fill structures for a design of a third layer of the electronic device adjacent to the first layer, such that the third pattern of fill structures has a predetermined offset from the first pattern of fill structures in a direction that is substantially parallel to both the first layer and the third layer.

54. The method recited in claim 53, wherein
a distance of the offset of the second pattern of fill structures is substantially an integral multiple of a distance of the offset of the third pattern of fill structures, or
the distance of the offset of the third pattern of fill structures is substantially an integral multiple of the distance of the offset of the second pattern of fill structures.

55. The method recited in claim 53, wherein the direction of the offset of the second pattern of fill structures is substantially the same as the direction of the offset of the third pattern of fill structures.

56. The method recited in claim 53, wherein
a distance of the offset of the second pattern of fill structures is substantially an integral multiple of a distance of the offset of the third pattern of fill structures, or the distance of the offset of the third pattern of fill structures is substantially an integral multiple of the distance of the offset of the second pattern of fill structures, and
the direction of the offset of the second pattern of fill structures is substantially the same as the direction of the offset of the third pattern of fill structures.

57. The method recited in claim 53, wherein the first pattern of fill structures, the second pattern of fill structures, and the third pattern of fill structures are a same pattern.

58. The method recited in claim 52, wherein the fill structures have a rectangular footprint.

59. The method recited in claim 58, wherein the fill structures have a square footprint.

60. The method recited in claim 52, wherein the first pattern of fill structures and the second pattern of fill structures each extends in a first pattern direction substantially parallel to both the first layer and the second layer and in a second pattern direction substantially orthogonal to the first pattern direction.

61. The method recited in claim 60, wherein each of the first pattern of fill structures and the second pattern of fill structures is an array having a regular spacing between fill structures in the first pattern direction.

62. The method recited in claim 60, wherein each of the first pattern of fill structures and the second pattern of fill structures is an array having a regular spacing between fill structures in the second pattern direction.

63. The method recited in claim 60, wherein each of the first pattern of fill structures and the second pattern of fill structures has a spacing between fill structures in the first pattern direction that is the same as a spacing between fill structures in the second pattern direction.

64. The method recited in claim 60, wherein the offset of the second pattern of fill structures is substantially in only the first pattern direction or substantially in only the second pattern direction.

65. The method recited in claim 60, wherein the offset of the second pattern of fill structures is in a direction having a first offset component in the first pattern direction and a second offset component in the second pattern direction.

66. The method recited in claim 65, wherein the second pattern of fill structures is substantially the same as the first pattern of fill structures.

67. The method recited in claim 66, wherein
a length of each fill structure in the first pattern direction is greater than a spacing between fill structures in the first pattern direction, and
the first offset component is substantially equal to or greater than the spacing between fill structures in the first pattern direction.

68. The method recited in claim 67, wherein the first offset component is less than or greater than a sum of the length of each fill structure in the first pattern direction with the spacing between fill structures in the first pattern direction.

69. The method recited in claim 66, wherein
a length of each fill structure in the second pattern direction is greater than a spacing between fill structures in the second pattern direction, and
the second offset component is substantially equal to or greater than a spacing between fill structures in the second pattern direction.

70. The method recited in claim 69, wherein the second offset component is less than or greater than a sum of the length of each fill structure in the second pattern direction and the spacing between fill structures in the second pattern direction.

71. The method recited in claim 52, wherein the offset minimizes overlap of fill structures in the first layer with fill structures in the second layer relative to a direction substantially perpendicular to the first layer and the second layer.

72. The method recited in claim 52, wherein the electronic device is an integrated circuit device or a printed circuit board.

* * * * *